US012588378B2

(12) United States Patent
Lee et al.

(10) Patent No.: US 12,588,378 B2
(45) Date of Patent: Mar. 24, 2026

(54) DISPLAY APPARATUS INCLUDING CONNECTING PATTERNS CONNECTING CONDUCTIVE PATTERS

(71) Applicant: Samsung Display Co., Ltd., Yongin-si (KR)

(72) Inventors: Kijune Lee, Yongin-si (KR); Younjoon Kim, Yongin-si (KR); Minjeong Oh, Yongin-si (KR); Sungeun Lee, Yongin-si (KR); Jinho Ju, Yongin-si (KR); Jonghyun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 289 days.

(21) Appl. No.: 18/322,473

(22) Filed: May 23, 2023

(65) Prior Publication Data

US 2024/0023391 A1      Jan. 18, 2024

(30) Foreign Application Priority Data

Jul. 14, 2022      (KR) ........................ 10-2022-0087081

(51) Int. Cl.
*H10K 59/131*       (2023.01)
*G09G 3/3233*       (2016.01)
*H10K 59/65*        (2023.01)

(52) U.S. Cl.
CPC ......... *H10K 59/131* (2023.02); *G09G 3/3233* (2013.01); *H10K 59/65* (2023.02)

(58) Field of Classification Search
CPC ...... G09G 3/32; G09G 3/3208; G09G 3/3216; G09G 3/3225; G09G 3/3233; G09G 3/3241; G09G 3/325; G09G 3/3258; G09G 3/3266; G09G 3/3275; G09G 3/3283; G09G 3/3291; G09G 2300/0421; G09G 2300/0426; H10K 59/1213; H10K 59/123; H10K 59/60; H10K 59/65
See application file for complete search history.

(56) References Cited

U.S. PATENT DOCUMENTS

| | | |
|---|---|---|
| 2015/0243242 A1 | 8/2015 | Eom |
| 2018/0145125 A1 | 5/2018 | Lee et al. |
| 2019/0081118 A1 | 3/2019 | Oh et al. |
| 2020/0185489 A1* | 6/2020 | Jo ........................ H10K 59/131 |
| 2020/0193917 A1* | 6/2020 | Park ..................... G09G 3/3266 |

(Continued)

FOREIGN PATENT DOCUMENTS

| | | |
|---|---|---|
| KR | 10-2018-0056497 A | 5/2018 |
| KR | 10-2019-0030798 A | 3/2019 |

(Continued)

*Primary Examiner* — Robert J May
(74) *Attorney, Agent, or Firm* — Womble Bond Dickinson (US) LLP

(57)          ABSTRACT

A display apparatus includes: a first conductive line extending in a first direction, and including a plurality of first conductive patterns that are spaced from each other; and a first connection line extending in the first direction on the first conductive line, and including a plurality of first connection patterns that are spaced from each other, the plurality of first connection patterns connecting the plurality of first conductive patterns to each other. In a plan view, the plurality of first conductive patterns and the plurality of first connection patterns are alternately located with each other along the first direction.

20 Claims, 12 Drawing Sheets

(56)                    References Cited

U.S. PATENT DOCUMENTS

| 2021/0359073 | A1  | 11/2021 | Cha et al. |
| 2021/0391407 | A1  | 12/2021 | Yoon et al. |
| 2022/0045158 | A1  | 2/2022  | Na et al. |
| 2022/0165839 | A1* | 5/2022  | Jo ......................... H10K 59/131 |
| 2022/0199747 | A1  | 6/2022  | Jung et al. |

FOREIGN PATENT DOCUMENTS

| KR | 10-2021-0142033 | A | 11/2021 |
| KR | 10-2021-0154301 | A | 12/2021 |
| KR | 10-2022-0018117 | A | 2/2022 |
| KR | 10-2022-0087663 | A | 6/2022 |

* cited by examiner

DISPLAY APPARATUS INCLUDING CONNECTING PATTERNS CONNECTING CONDUCTIVE PATTERS

CROSS-REFERENCE TO RELATED APPLICATION

This application claims priority to and the benefit of Korean Patent Application No. 10-2022-0087081, filed on Jul. 14, 2022, in the Korean Intellectual Property Office, the entire disclosure of which is incorporated by reference herein.

BACKGROUND

1. Field

Aspects of one or more embodiments of the present disclosure relate to a display apparatus.

2. Description of the Related Art

A display apparatus visually displays data. A display apparatus may be used as a display of a small-sized product, such as a mobile phone, or may be used as a display of a large-sized product, such as a television.

A display apparatus includes a plurality of pixels for receiving electrical signals in order to emit light to display an image to the outside. Each of the plurality of pixels includes a display element. For example, an organic light-emitting display apparatus includes an organic light-emitting diode as a display element. Generally, an organic light-emitting display apparatus includes a thin-film transistor and an organic light-emitting diode on a substrate, and the organic light-emitting diode emits light by itself (e.g., is self-emissive).

Recently, as the use of display apparatuses has been diversified, various designs have been attempted to improve the quality of the display apparatuses.

The above information disclosed in this Background section is for enhancement of understanding of the background of the present disclosure, and therefore, it may contain information that does not constitute prior art.

SUMMARY

One or more embodiments of the present disclosure are directed to a display apparatus having improved resolution.

Additional aspects and features will be set forth, in part, in the description that follows, and in part, will be apparent from the description, or may be learned by practicing one or more of the presented embodiments of the present disclosure.

According to one or more embodiments of the present disclosure, a display apparatus includes: a first conductive line extending in a first direction, and including a plurality of first conductive patterns that are spaced from each other; and a first connection line extending in the first direction on the first conductive line, and including a plurality of first connection patterns that are spaced from each other, the plurality of first connection patterns connecting the plurality of first conductive patterns to each other. In a plan view, the plurality of first conductive patterns and the plurality of first connection patterns are alternately located with each other along the first direction.

In an embodiment, a transmittance of the first connection line may be greater than a transmittance of the first conductive line.

In an embodiment, the first connection line may include a transparent conductive material.

In an embodiment, the display apparatus may further include: a second conductive line extending in the first direction, and including a plurality of second conductive patterns that are spaced from each other; a second connection line extending in the first direction on the second conductive line, and including a plurality of second connection patterns that are spaced from each other, the second connection patterns connecting the plurality of second conductive patterns to each other; and a plurality of pixels in a matrix arrangement configured to receive a first voltage through the first conductive line, and a second voltage having a different level from that of the first voltage through the second conductive line. In a plan view, the plurality of second conductive patterns and the plurality of second connection patterns may be alternately located with each other along the first direction.

In an embodiment, each of the plurality of pixels may include: a display element having an anode and a cathode; a driving transistor configured to control a driving current flowing to the display element; a first initialization transistor configured to apply the first voltage to a gate of the driving transistor in response to a first scan signal; and a second initialization transistor configured to apply the second voltage to the anode of the display element in response to a second scan signal.

In an embodiment, the display apparatus may further include: a third conductive line extending in a second direction crossing the first direction, and connected to the first conductive line through the first connection line; and a fourth conductive line extending in the second direction, and connected to the second conductive line through the second connection line.

In an embodiment, the first conductive line may include a plurality of first conductive lines, the second conductive line may include a plurality of second conductive lines, the third conductive line may include a plurality of third conductive lines, and the fourth conductive line may include a plurality of fourth conductive lines. The plurality of first conductive lines and the plurality of second conductive lines may be alternately located with each other along the second direction, and the plurality of third conductive lines and the plurality of fourth conductive lines may be alternately located with each other along the first direction.

In an embodiment, the first conductive line may include a plurality of first conductive lines, the second conductive line may include a plurality of second conductive lines, the third conductive line may include a plurality of third conductive lines, and the fourth conductive line may include a plurality of fourth conductive lines. Each of the plurality of first conductive lines and the plurality of second conductive lines may be located at each corresponding pixel row, and each of the plurality of third conductive lines and the plurality of fourth conductive lines may be located at every corresponding two pixel columns.

In an embodiment, a first distance between a first conductive line and a second conductive line that are adjacent to each other in the second direction from among the plurality of first conductive lines and the plurality of second conductive lines may be less than a second distance between a third conductive line and a fourth conductive line that are adjacent to each other in the first direction from among the plurality of third conductive lines and the plurality of fourth conductive lines. In an embodiment, the plurality of third conductive lines may be located at different pixel columns from those of the plurality of fourth conductive lines.

In an embodiment, the first conductive line may include a plurality of first conductive lines, the second conductive line may include a plurality of second conductive lines, the third conductive line may include a plurality of third conductive lines, and the fourth conductive line may include a plurality of fourth conductive lines. Each of the plurality of first conductive lines and the plurality of second conductive lines may be located at every two corresponding pixel columns, and each of the plurality of third conductive lines and the plurality of fourth conductive lines may be located at each corresponding pixel row.

In an embodiment, a first distance between a first conductive line and a second conductive line that are adjacent to each other in the second direction from among the plurality of first conductive lines and the plurality of second conductive lines may be greater than a second distance between a third conductive line and a fourth conductive line that are adjacent to each other in the first direction from among the plurality of third conductive lines and the plurality of fourth conductive lines.

In an embodiment, the plurality of first conductive lines may be located at different pixel columns from those of the plurality of second conductive lines.

In an embodiment, the display apparatus may further include: a plurality of third conductive patterns connected to the first conductive line through the first connection line, a longitudinal direction of the plurality of third conductive patterns being the second direction; and a plurality of fourth conductive patterns connected to the second conductive line through the second connection line, a longitudinal direction of the plurality of fourth conductive patterns being the second direction. The third conductive line may include a plurality of third conductive lines and the fourth conductive line may include a plurality of fourth conductive lines. The plurality of third conductive lines may be connected to the first conductive line through first-first connection patterns corresponding to some of the plurality of first connection patterns, and the plurality of third conductive patterns may be connected to the first conductive line through first-second connection patterns corresponding to some others of the plurality of first connection patterns. The plurality of fourth conductive lines may be connected to the second conductive line through second-first connection patterns corresponding to some of the plurality of second connection patterns, and the plurality of fourth conductive patterns may be connected to the second conductive line through second-second connection patterns corresponding to some others of the plurality of second connection patterns.

In an embodiment, the first-first connection patterns and the first-second connection patterns may be alternately located with each other along the first direction; and the second-first connection patterns and the second-second connection patterns may be alternately located with each other along the first direction.

In an embodiment, the plurality of third conductive lines may be located at different pixel columns from those of the plurality of third conductive patterns; the plurality of fourth conductive lines may be located at different pixel columns from those of the plurality of fourth conductive patterns; the plurality of third conductive lines and the plurality of fourth conductive patterns may be located at a same pixel column as each other; and the plurality of fourth conductive lines and the plurality of third conductive patterns may be located at a same pixel column as each other.

In an embodiment, the display apparatus may further include: a third connection pattern having a longitudinal direction in the first direction; a third conductive pattern connected to the third conductive line through the third connection pattern; a fourth connection pattern having a longitudinal direction in the first direction; and a fourth conductive pattern connected to the fourth conductive line through the fourth connection pattern. A length of each of the plurality of first connection patterns in the first direction may be greater than a length of the third connection pattern in the first direction, and a length of each of the plurality of second connection patterns in the first direction may be greater than a length of the fourth connection pattern in the first direction.

In an embodiment, the plurality of first connection patterns may be located at different pixel columns from that of the third connection pattern; the plurality of second connection patterns may be located at different pixel columns from that of the fourth connection pattern; the plurality of first connection patterns and the fourth connection pattern may be located at a same pixel column as each other; and the plurality of second connection patterns and the third connection pattern may be located at a same pixel column as each other.

In an embodiment, the display apparatus may further include: a substrate including a first area, and a second area at least partially surrounded by the first area; a pixel circuit at the first area; a display element at the second area, and electrically connected to the pixel circuit; and a connection line connecting the pixel circuit to the display element, and located at a same layer as that of the first connection line.

In an embodiment, the display apparatus may further include a component under the substrate at the second area.

The above and other aspects and features of the present disclosure will be apparent from the detailed description, the figures, and the claims and their equivalents.

The general and specific aspects and features of the present disclosure may be embodied using a system, a method, a computer program, and/or a combination of a system, a method, and a computer program.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
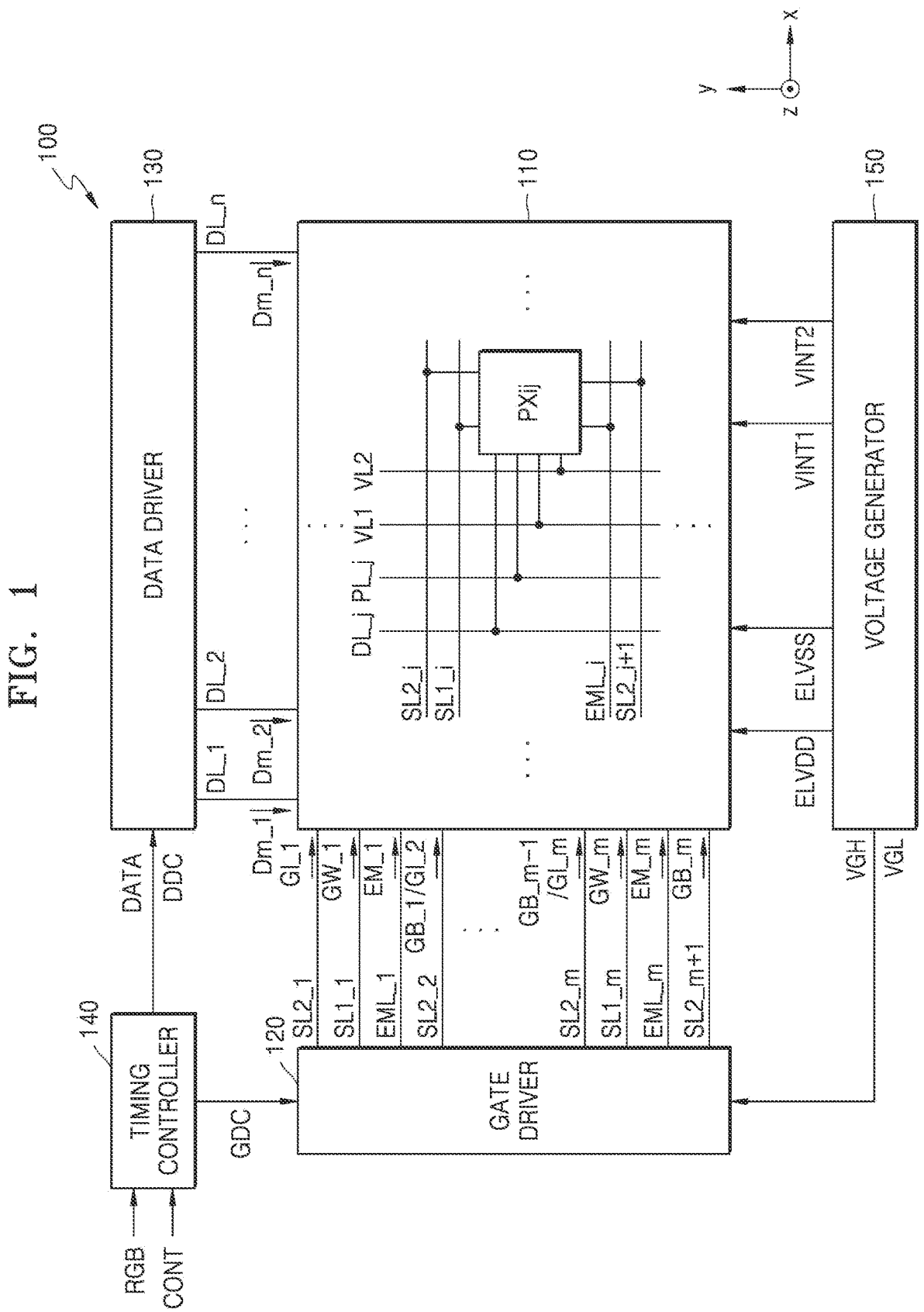
FIG. 1 is a schematic block diagram of a display apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic block diagram of a display apparatus according to an embodiment.

The display apparatus may be an organic light-emitting display apparatus including a display element, in which the brightness thereof changes according to a current, for example, such as an organic light-emitting diode. As another example, the display apparatus may be an inorganic light-emitting display apparatus, an inorganic electroluminescence (EL) display apparatus, or a quantum dot light-emitting display apparatus. In other words, an emission layer of the display element of the display apparatus may include an organic material, an inorganic material, quantum dots, an organic material and quantum dots, an inorganic material and quantum dots, or an organic material, an inorganic material, and quantum dots. Hereinafter, the display apparatus may be mainly described in more detail in the context of an organic light-emitting display apparatus 100.

Referring to FIG. 1, the organic light-emitting display apparatus 100 includes a display unit (e.g., a display or a touch-display) 110, a gate driver 120, a data driver 130, a timing controller 140, and a voltage generator 150.

The display unit 110 includes pixels PX, such as a pixel PXij positioned at (e.g., in or on) an i-th row and a j-th column. Although only one pixel PXij is illustrated in FIG. 1 for convenience of illustration, m×n pixels PX may be arranged, for example, in a matrix configuration, where m and n are natural numbers. Here, i is a natural number of 1 or more and m or less, and j is a natural number of 1 or more and n or less.

A pixel PX including seven transistors and one capacitor is mainly described in more detail below for illustrative purposes. However, embodiments of the present disclosure may not only be applied to a pixel PX employing such a pixel circuit, but may also be applied to other suitable pixel circuits, for example, such as a pixel PX employing a pixel circuit including two transistors and one capacitor.

The pixels PX are connected to first scan lines SL1_1 to SL1_*m*, second scan lines SL2_1 to SL2_*m*+1, emission control lines EML_1 to EML_m, and data lines DL_1 to DL_n. The pixels PX are connected to power lines PL_1 to PL_n, a first voltage line VL1, and a second voltage line VL2. For example, as shown in FIG. 1, the pixel PXij positioned at (e.g., in or on) the i-th row and the j-th column may be connected to a first scan line SL1_*i*, a second scan line SL2_*i*, an emission control line EML_i, a data line DL_j, a power line PL_j, the first voltage line VL1, the second voltage line VL2, and a second scan line SL2_*i*+1. The second scan line SL2_*i*+1 may be referred to as a third scan line with respect to the pixel PXij.

According to another example, the pixel PXij may be connected to some lines from among the first scan line SL1_*i*, the second scan line SL2_*i*, the emission control line EML_i, the data line DLJ, the power line PL_j, the first voltage line VL1, the second voltage line VL2, and the second scan line SL2_41. For example, the pixel PXij may be connected to the first scan line SL1_*i*, the data line DLJ, and the power line PL_j.

The data lines DL_1 to DL_n and the power lines PL_1 to PL_n may extend in a second direction (e.g., a column direction or a ±y direction), and may be connected to pixels PX positioned at (e.g., in or on) the same column as each other. The first scan lines SL1_1 to SL1_*m*, the second scan lines SL2_1 to SL2_*m*+1, and the emission control lines EML_1 to EML_m may extend in a first direction (e.g., a row direction or a ±x direction), and may be connected to pixels PX positioned at (e.g., in or on) the same row as each other. Each of the first voltage line VL1 and the second voltage line VL2 may include a plurality of horizontal lines extending in the first direction (e.g., the ±x direction), and the plurality of horizontal lines may be connected to pixels PX positioned at (e.g., in or on) the same row as each other. Each of the first voltage line VL1 and the second voltage line VL2 may include a plurality of vertical lines extending in the second direction (e.g., the ±y direction), and the plurality of vertical lines may be connected to pixels PX positioned at (e.g., in or on) the same column as each other. The plurality of horizontal lines and the plurality of vertical lines may be connected to each other, and the first voltage line VL1 and the second voltage line VL2 may have a mesh structure.

The first scan lines SL1_1 to SL1_*m* are configured to respectively transfer first scan signals GW_1 to GW_m output from the gate driver 120 to pixels PX at (e.g., in or on) the same row as each other. The second scan lines SL2_1 to SL2_*m* are configured to respectively transfer second scan signals GI_1 to GI_m output from the gate driver 120 to pixels PX at (e.g., in or on) the same row as each other. The second scan lines SL2_2 to SL2_*m*+1 are configured to respectively transfer third scan signals GB_1 to GB_m output from the gate driver 120 to pixels PX at (e.g., in or on) the same row as each other. The second scan signal GI_i and the third scan signal GB_i−1 may be the same signal as each other transferred through the second scan line SL2_*i*.

The emission control lines EML_1 to EML_m are configured to respectively transfer emission control signals EM_1 to EM_m output from the gate driver 120 to pixels PX at (e.g., in or on) the same row as each other. The data lines DL_1 to DL_n are configured to respectively transfer data voltages Dm_1 to Dm_n output from the data driver 130 to pixels PX at (e.g., in or on) the same column as each other. The pixel PXij positioned at (e.g., in or on) the i-th row and the j-th column receives first to third scan signals GW_i, GI_i, and GB_i, a data voltage Dm_j, and an emission control signal EM_i.

Each of the power lines PL_1 to PL_n is configured to transfer a first driving voltage ELVDD output from the voltage generator 150 to pixels PX at (e.g., in or on) the same column as each other. According to another example, the first driving voltage ELVDD may be transferred to pixels PX at (e.g., in or on) the same row as each other through power lines extending in the first direction (e.g., the ±x direction).

The first voltage line VL1 is configured to transfer a first initialization voltage VINT1 output from the voltage generator 150 to the pixels PX. The second voltage line VL2 is configured to transfer a second initialization voltage VINT2 output from the voltage generator 150 to the pixels PX.

The pixel PXij includes a display element, and a driving transistor configured to control the magnitude of a current flowing to the display element based on the data voltage Dm_j. The data voltage Dm_j is output from the data driver 130, and is received by the pixel PXij through the data line DL_j. The display element may be, for example, an organic light-emitting diode. Because the display element emits light having a desired brightness corresponding to the magnitude of a current received from a driving transistor, the pixel PXij may express a grayscale (e.g., a grayscale level) corresponding to the data voltage Dm_j. A pixel PX may correspond to a portion, for example, such as a sub-pixel, of a unit pixel that may express full colors. The pixel PXij may further include at least one switching transistor, and at least one capacitor. The pixel PXij is described in more detail below.

The voltage generator 150 may generate voltages used for driving the pixel Pxij. As an example, the voltage generator 150 may generate the first driving voltage ELVDD, a second driving voltage ELVSS, the first initialization voltage VINT1, and the second initialization voltage VINT2. The level of the first driving voltage ELVDD may be greater than the level of the second driving voltage ELVSS. The level of the second initialization voltage VINT2 may be greater than the level of the first initialization voltage VINT1. The level of the second initialization voltage VINT2 may be greater than the level of the second driving voltage ELVSS. A difference between the second initialization voltage VINT2 and the second driving voltage ELVSS may be less than a threshold voltage used for the display element of the pixel PX to emit light.

The voltage generator 150 may be configured to generate a first gate voltage VGH and a second gate voltage VGL for controlling the switching transistor of the pixel PXij, and may provide the first gate voltage VGH and the second gate voltage VGL to the gate driver 120. When the first gate voltage VGH is applied to a gate of the switching transistor, the switching transistor may be turned off, and when the second gate voltage VGL is applied to the gate of the switching transistor, the switching transistor may be turned on. The first gate voltage VGH may be referred to as a turn-off voltage, and the second gate voltage VGL may be referred to as a turn-on voltage. Switching transistors of the pixel PXij may be p-type metal oxide semiconductor field-effect transistors (MOSFET), and the level of the first gate voltage VGH may be greater than the level of the second gate voltage VGL. In some embodiments, the voltage generator 150 may generate gamma reference voltages, and may provide the gamma reference voltages to the data driver 130.

The timing controller 140 may be configured to control the display unit 110, by controlling operation timings of the gate driver 120 and the data driver 130. The pixels PX of the display unit 110 may display images corresponding to image source data RGB of one frame, by receiving a new data voltage Dm and emitting light having a desired brightness corresponding to the data voltage Dm received for every frame period.

In an embodiment, one frame period may include a gate initialization period, a data-write and anode initialization period, and an emission period. In the gate initialization period, the first initialization voltage VINT1 may be applied to the pixels PX in synchronization with the second scan signal GI. In the data-write and anode initialization period, the data voltage Dm may be provided to the pixels PX in synchronization with the first scan signal GW, and the second initialization voltage VINT2 may be applied to the pixels PX in synchronization with the third scan signal GB. In the emission period, the pixels PX of the display unit 110 emit light.

The timing controller 140 receives the image source data RGB and control signals CONT from the outside. The timing controller 140 may convert the image source data RGB into image data DATA based on the characteristics and the like of the display unit 110 and the pixels PX. The timing controller 140 may provide the image data DATA to the data driver 130.

The control signals CONT may include a vertical synchronization signal Vsync, a horizontal synchronization signal Hsync, a data enable signal DE, a clock signal CLK, and the like. The timing controller 140 may be configured to control an operation timing of the gate driver 120 and the data driver 130 by using the control signals CONT. The timing controller 140 may determine a frame period by counting the data enable signal DE of a horizontal scanning period. In this case, the vertical synchronization signal Vsync and the horizontal synchronization signal Hsync supplied from the outside may be omitted. The image source data RGB includes luminance information of the pixels PX. The luminance may have a suitable number or level (e.g., a predetermined number or level), for example, such as 1024 $(=2^{10})$, 256, $(=2^8)$, or 64 $(=2^6)$ grayscales (e.g., grayscale levels).

The timing controller 140 may be configured to generate control signals including a gate timing control signal GDC for controlling an operation timing of the gate driver 120, and a data timing control signal DDC for controlling an operation timing of the data driver 130.

The gate timing control signal GDC may include a gate start pulse GSP, a gate shift clock GSC, a gate output enable signal GOE, and the like. The gate start pulse GSP is supplied to the gate driver 120 at a start point of a scan period. The gate shift clock GSC is a clock signal input in common to the gate driver 120, and is a clock signal for shifting a gate start pulse GSP. The gate output enable signal GOE is configured to control an output of the gate driver 120.

The data timing control signal DDC may include a source start pulse SSP, a source sampling clock SSC, a source output enable signal SOE, and the like. The source start pulse SSP is configured to control a data sampling start point of the data driver 130, and is provided to the data driver 130 at a start point of a scan period. The source sampling clock SSC is a clock signal configured to control a data sampling operation within the data driver 130 based on a rising or falling edge. The output enable signal SOE is configured to control an output of the data driver 130. The source start pulse SSP supplied to the data driver 130 may be omitted, depending on a data transmission method.

The gate driver 120 is configured to sequentially generate first scan signals GW_1 to GW_m, second scan signals GI_1 to GI_m, and third scan signals GB_1 to GB_m in response to the gate timing control signal GDC supplied from the timing controller 140, by using the first and second gate voltages VGH and VGL provided from the voltage generator 150.

The data driver 130 samples and latches the image data DATA supplied from the timing controller 140 in response to the data timing control signal DDC supplied from the timing controller 140, and converts the image data DATA to data of a parallel data system. When converting the image data DATA into the data of the parallel data system, the data driver 130 converts the image data DATA into a gamma reference voltage, thereby converting the image data DATA into a data voltage of an analog form. The data driver 130 provides data voltages Dm_1 to Dm_n to the pixels PX through the data lines DL_1 to DL_n. The pixels PX receive the data voltages Dm_1 to Dm_n in response to the first scan signals GW_1 to GW_m.

Figure 2:
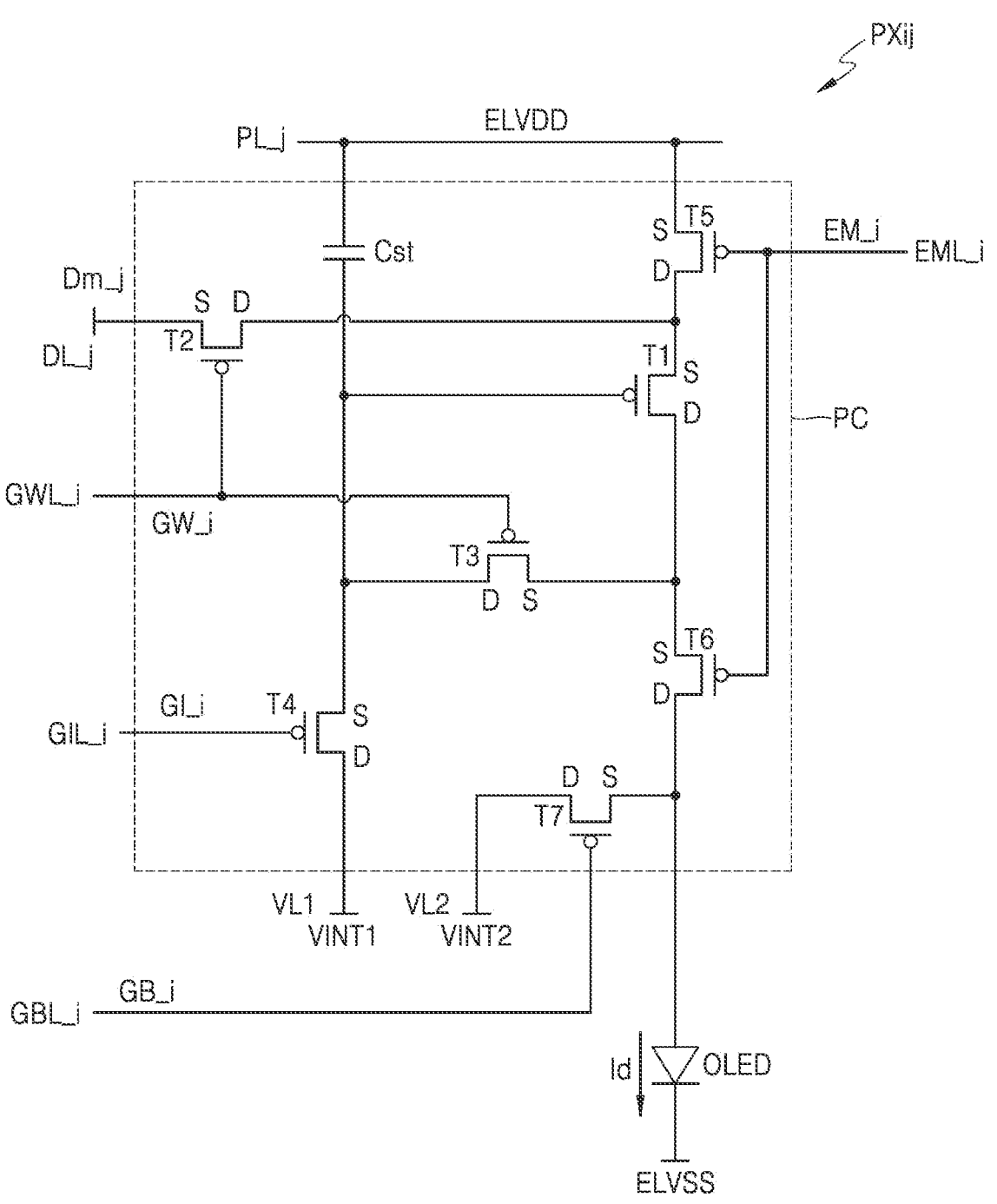
FIG. 2 is an equivalent circuit diagram of a pixel according to an embodiment.

FIG. 2 is an equivalent circuit diagram of a pixel according to an embodiment.

Referring to FIG. 2, the pixel PXij is connected to first to third scan lines GWL_i, GIL_i, and GBL_i configured to transfer first to third scan signals GW_i, GI_i, and GB_i, respectively, a data line DLJ configured to transfer a data voltage Dm_j, and an emission control line EML_i configured to transfer an emission control signal EM_i. The pixel PXij is connected to a power line PL_j configured to transfer the first driving voltage ELVDD, a first voltage line VL1 configured to transfer the first initialization voltage VINT1, and a second voltage line VL2 configured to transfer the second initialization voltage VINT2. The pixel PXij is connected to a common electrode to which the second driving voltage ELVSS is applied. The pixel PXij may correspond to the pixel PXij illustrated in FIG. 1.

The first scan line GWL_i corresponds to the first scan line SL1_$i$ illustrated in FIG. 1, the second scan line GIL_$i$ corresponds to the second scan line SL2_i illustrated in FIG. 1, and the third scan line GBL_i corresponds to the second scan line SL2_i+1 illustrated in FIG. 1.

The pixel PXij includes a pixel circuit PC and a display element OLED. The pixel circuit PC may include first to seventh transistors T1 to T7, and a storage capacitor Cst. The display element OLED may be an organic light-emitting diode having an anode and a cathode. The cathode may be the common electrode to which the second driving voltage ELVSS is applied.

The first transistor T1 may be a driving transistor, in which the magnitude of a drain current is determined according to a gate-source voltage, and the second to seventh transistors T2, T3, T4, T5, T6, and T7 may be switching transistors that are turned on/off according to a gate-source voltage, or substantially a gate voltage.

The first transistor T1 may be referred to as a driving transistor, the second transistor T2 may be referred to as a scan transistor, the third transistor T3 may be referred to as a compensation transistor, the fourth transistor T4 may be referred to as a gate initialization transistor, the fifth transistor T5 may be referred to as a first emission control transistor, the sixth transistor T6 may be referred to as a second emission control transistor, and the seventh transistor T7 may be referred to as an anode initialization transistor.

The storage capacitor Cst is connected between the power line PL_j and the gate of the driving transistor T1. The storage capacitor Cst may have an upper electrode connected to the power line PL_j, and a lower electrode connected to the gate of the driving transistor T1.

The driving transistor T1 may be configured to control the magnitude of a current Id flowing from the power line PL_j to the display element OLED according to the gate-source voltage thereof. The driving transistor T1 may have the gate connected to the lower electrode of the storage capacitor Cst, a source connected to the power line PL_j through the first emission control transistor T5, and a drain connected to the display element OLED through the second emission control transistor T6.

The driving transistor T1 may output the driving current Id to the display element OLED according to the gate-source voltage thereof. The magnitude of the driving current Id is determined based on the difference between the gate-source voltage of the driving transistor T1 and the threshold voltage thereof. The display element OLED may receive the driving current Id from the driving transistor T1, and emit light having a desired brightness according to the magnitude of the driving current Id.

The scan transistor T2 is configured to transfer the data voltage Dm_j to the source of the driving transistor T1 in response to the first scan signal GW_i. The scan transistor T2 may have a gate connected to the first scan line GWL_i, a source connected to the data line DLJ, and a drain connected to the source of the driving transistor T1.

The compensation transistor T3 connects the drain and the gate of the driving transistor T1 to each other in response to the first scan signal GW_i. The compensation transistor T3 may have a gate connected to the first scan line GWL_i, a source connected to the drain of the driving transistor T1, and a drain connected to the gate of the driving transistor T1.

The gate initialization transistor T4 is configured to apply the first initialization voltage VINT1 to the gate of the driving transistor T1 in response to the second scan signal GI_i. The gate initialization transistor T4 may have a gate connected to the second scan line GIL_i, a source connected to the gate of the driving transistor T1, and a drain connected to the first voltage line VL1.

The anode initialization transistor T7 is configured to apply the second initialization voltage VINT2 to the anode of the display element OLED in response to the third scan signal GB_i. The anode initialization transistor T7 may have a gate connected to the third scan line GBL_i, a source connected to the anode of the display element OLED, and a drain connected to the second voltage line VL2.

The first emission control transistor T5 may connect the power source line PL_j and the source of the driving transistor T1 to each other in response to the emission control signal EM_i. The first emission control transistor T5 may have a gate connected to the emission control line EML_i, a source connected to the power line PL_j, and a drain connected to the source of the driving transistor T1.

The second emission control transistor T6 may connect the drain of the driving transistor T1 and the anode of the display element OLED to each other in response to the emission control signal EM_i. The second emission control transistor T6 may have a gate connected to the emission control line EML_i, a source connected to the drain of the driving transistor T1, and a drain connected to the anode of the display element OLED.

The second scan signal GI_i may be synchronized or substantially synchronized with a first scan signal GW_i−1 of a previous row. The third scan signal GB_i may be synchronized or substantially synchronized with the first scan signal GW_i. According to another example, the third scan signal GB_i may be synchronized or substantially synchronized with a first scan signal GW_i+1 of a next row.

Hereinafter, an operation process of a pixel of the organic light-emitting diode display according to an embodiment is be described in more detail.

First, when the emission control signal EM_i having a high level is received, the first emission control transistor T5 and the second emission control transistor T6 are turned off, the driving transistor T1 stops outputting the driving current Id, and the display element OLED stops emitting light.

Thereafter, during a gate initialization period, in which the second scan signal GI_i having a low level is received, the gate initialization transistor T4 is turned on, and the first initialization voltage VINT1 is applied to the gate of the driving transistor T1, or in other words, to the lower electrode of the capacitor Cst. A difference (e.g., ELVDD−VINT1) between the driving voltage ELVDD and the first initialization voltage VINT1 is stored in the storage capacitor Cst.

Thereafter, during a data writing period in which the first scan signal GW_i having a low level is received, the scan transistor T2 and the compensation transistor T3 are turned on, and the data voltage Dmj is applied to the source of the driving transistor T1. The driving transistor T1 is diode-connected by the compensation transistor T3, and is forward biased. The gate voltage of the driving transistor T1 rises from the first initialization voltage VINT1. When the gate voltage of the driving transistor T1 is equal to or substantially equal to a data compensation voltage (e.g., Dm_j−|Vth|) obtained by decreasing the data voltage Dmj by the threshold voltage Vth of the driving transistor T1, the driving transistor T1 is turned off, and the increase of the gate voltage of the driving transistor T1 is stopped. Accordingly, a difference (e.g., ELVDD−Dm_j+|Vth|) between the driving voltage ELVDD and the data compensation voltage (e.g., Dm_j−|Vth|) is stored in the storage capacitor Cst.

Also, during an anode initialization period, in which the third scan signal GB_i having a low level is received, the anode initialization transistor T7 is turned on, and the second initialization voltage VINT2 is applied to the anode of the display element OLED. By applying the second initialization voltage VINT2 to the anode of the display element OLED, the display element OLED may be stopped (e.g., completely stopped) from emitting light, and thus, a phenomenon in which the display element OLED slightly emits light in response to a black grayscale (e.g., a black grayscale level) in a next frame be eliminated, prevented, or reduced.

The level of the second initialization voltage VINT2 may be greater than the level of the first initialization voltage VINT1, and may be less than a voltage level that is greater than the second driving voltage ELVSS by the threshold voltage of the display element OLED. Because the display element OLED has a relatively large size, the display element OLED has a fairly large capacitance. In addition, because the level of the first initialization voltage VINT1 is low, the display element OLED may start to emit light after a significant delay time in the next frame. However, according to the present embodiment, by initializing the anode of the display element OLED with the second initialization voltage VINT2 having a level greater than the level of the first initialization voltage VINT1, the display element OLED may start to emit light within a short time in the next frame. In other words, the light emission delay may be prevented or reduced.

The first scan signal GW_i and the third scan signal GB_i may be synchronized or substantially synchronized with each other. In this case, the data writing period and the anode initialization period may be the same or substantially the same as each other.

When the emission control signal EM_i having a low level is received, the first emission control transistor T5 and the second emission control transistor T6 may be turned on, the driving transistor T1 may output the driving current Id corresponding to the voltage stored in the storage capacitor Cst, or in other words, the voltage (e.g., ELVDD−Dm) obtained by subtracting the threshold voltage |Vth| of the driving transistor T1 from the source-gate voltage (e.g., ELVDD−Dm_j+|Vth|) of the driving transistor T1, and the display element OLED may emit light having a desired luminance corresponding to the magnitude of the driving current Id.

Figure 3:
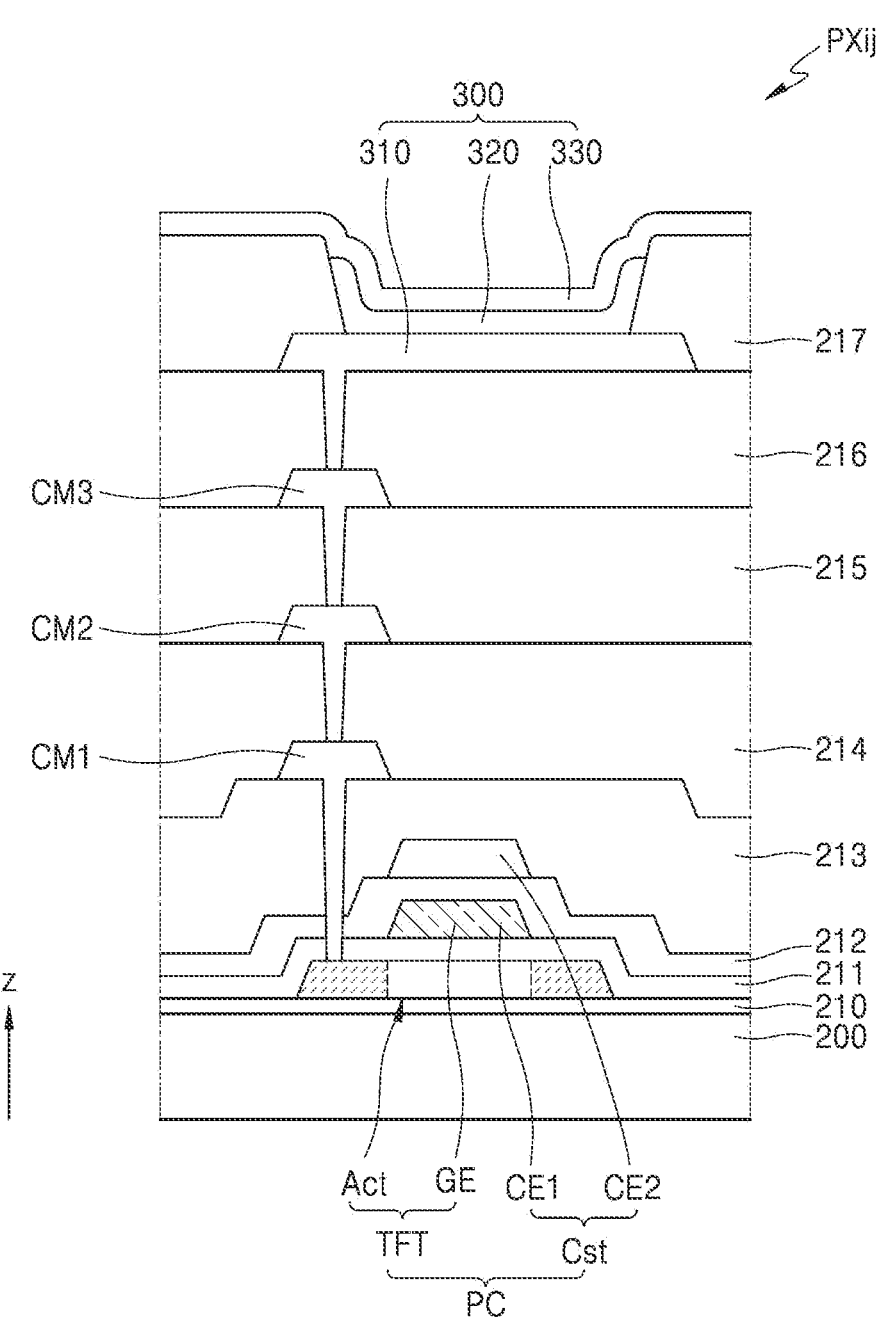
FIG. 3 is a schematic cross-sectional view of a pixel according to an embodiment.

FIG. 3 is a schematic cross-sectional view of a pixel PXij according to an embodiment.

Referring to FIG. 3, the pixel PXij may include a pixel circuit PC and a display element 300. The pixel circuit PC may include at least one transistor TFT, and a storage capacitor Cst. The at least one transistor TFT may include a semiconductor layer Act and a gate electrode GE. The storage capacitor Cst may include a lower electrode CE1 and an upper electrode CE2. The display element 300 may be an organic light-emitting diode having an anode and a cathode.

Hereinafter, a configuration of the pixel PXij is described in more detail according to a stacked structure with reference to FIG. 3.

A substrate 200 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, or the like. The substrate 200 including the polymer resin may be flexible, rollable, or bendable. The substrate 200 may have a multi-layered structure including a layer including the polymer resin described above, and an inorganic layer.

A buffer layer 210 may reduce or block the penetration of foreign materials, moisture, and/or external air from below the substrate 200, and may provide a flat or substantially flat surface on the substrate 200. The buffer layer 210 may include an inorganic material, such as an oxide or a nitride, an organic material, or an organic and inorganic compound, and may have a single-layer structure or a multi-layered structure including an inorganic material and an organic material.

A barrier layer may be further included between the substrate 200 and the buffer layer 210. The barrier layer may prevent or reduce the penetration of impurities from the substrate 200 into the semiconductor layer Act. The barrier layer may include an inorganic material, such as an oxide or nitride, an organic material, or an organic and inorganic compound, and may have a single-layer structure or a multi-layered structure including an inorganic material and an organic material.

The semiconductor layer Act may be disposed on the buffer layer 210. The semiconductor layer Act may include amorphous silicon or polysilicon. In an embodiment, the semiconductor layer Act may include an oxide of at least one material selected from the group consisting of indium (In), gallium (Ga), stanium (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

The semiconductor layer Act may include a channel region, and a source region and a drain region disposed on opposite sides of the channel region. The semiconductor layer Act may include a single layer or multiple layers.

A first gate insulating layer 211 and a second gate insulating layer 212 may be stacked on the substrate 200 to cover the semiconductor layer Act. The first gate insulating layer 211 and the second gate insulating layer 212 may each include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

The gate electrode GE may be disposed on the first gate insulating layer 211 to at least partially overlap with the semiconductor layer Act. The gate electrode GE may include molybdenum (Mo), Al, copper (Cu), Ti, or the like, and may include a single layer or multiple layers. For example, the gate electrode GE may include a single Mo layer.

In an embodiment, the storage capacitor Cst may include a lower electrode CE1 and an upper electrode CE2, and may overlap with the transistor TFT, as shown in FIG. 3. For example, the gate electrode GE of the transistor TFT may function as the lower electrode CE1 of the storage capacitor Cst. However, the present disclosure is not limited thereto, and the storage capacitor Cst may not overlap with the transistor TFT, and may be provided separately from the transistor TFT.

The upper electrode CE2 of the storage capacitor Cst overlaps with the lower electrode CE1 with the second gate insulating layer 212 therebetween, to form a capacitor. In this case, the second gate insulating layer 212 may function as a dielectric layer of the storage capacitor Cst.

An interlayer insulating layer 213 may be provided on the second gate insulating layer 212 to cover the upper electrode CE2 of the storage capacitor Cst. The interlayer insulating layer 213 may include $SiO_2$, $SiN_x$, SiON, $Al_2O_3$, $TiO_2$, $Ta_2O_5$, $HfO_2$, $ZnO_2$, or the like.

A first connection electrode CM1 may be disposed on the interlayer insulating layer 213. The first connection electrode CM1 may include a conductive material including Mo, Al, Cu, Ti, or the like, and may include multiple layers or a single layer including one or more of the conductive materials. For example, the first connection electrode CM1 may have a multi-layered structure including Ti/Al/Ti layers. The first connection electrode CM1 may be connected to the source region or the drain region of the semiconductor layer Act through a contact hole formed in (e.g., penetrating) the first gate insulating layer 211, the second gate insulating layer 212, and the interlayer insulating layer 213.

The first connection electrode CM1 may be covered by an inorganic protective layer. The inorganic protective layer may include a single layer or multiple layers including silicon nitride ($SiN_x$) and silicon oxide ($SiO_x$). The inorganic protective layer may be included to cover and protect some wiring lines disposed on the interlayer insulating layer 213.

A first planarization layer 214 may be provided on the interlayer insulating layer 213 to cover the first connection electrode CM1. The first planarization layer 214 may include a single layer or multiple layers including an organic material, and provides a flat or substantially flat top surface. The first planarization layer 214 may include a general-purpose commercial polymer, such as benzocyclobutene (BCB), polyimide, hexamethyldisiloxane (HMDSO), polymethyl methacrylate (PMMA), or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a suitable blend thereof, or the like.

A second connection electrode CM2 may be disposed on the first planarization layer 214. The second connection electrode CM2 may include a conductive material including Mo, Al, Cu, Ti, or the like, and may include multiple layers or a single layer including one or more of the conductive materials. For example, the second connection electrode CM2 may have a multi-layered structure including Ti/Al/Ti layers. The second connection electrode CM2 may be connected to the first connection electrode CM1 through a contact hole formed in (e.g., penetrating) the first planarization layer 214.

A second planarization layer 215 may be provided on the first planarization layer 214 to cover the second connection electrode CM2. The second planarization layer 215 may include a single layer or multiple layers including an organic material, and provides a flat or substantially flat top surface. The second planarization layer 215 may include a general-purpose commercial polymer, such as BCB, polyimide, HMDSO, PMMA, or PS, a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a suitable blend thereof, or the like.

A third connection electrode CM3 may be disposed on the second planarization layer 215. The third connection electrode CM3 may include a transparent conductive material. For example, the third connecting electrode CM3 may include a transparent conducting oxide (TCO). The third connection electrode CM3 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). The third connection electrode CM3 may be connected to the second connection electrode CM2 through a contact hole formed in (e.g., penetrating) the second planarization layer 215.

A third planarization layer 216 may be provided on the second planarization layer 215 to cover the third connection electrode CM3. The third planarization layer 216 may include a single layer or multiple layers including an organic material, and provides a flat or substantially flat top surface. The third planarization layer 216 may include a general-purpose commercial polymer, such as BCB, polyimide, HMDSO, PMMA, or PS, a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a suitable blend thereof, or the like.

FIG. 3 illustrates an example in which the first planarization layer 214, the second planarization layer 215, and the third planarization layer 216 are arranged. However, in another embodiment, at least one of the first planarization layer 214, the second planarization layer 215, and the third planarization layer 216 may be omitted. For example, the second planarization layer 215 may be omitted.

The display element 300 may be disposed on the third planarization layer 216. The display element 300 may include a pixel electrode 310, an intermediate layer 320 including an organic emission layer, and an opposite electrode 330. The display element 300 may be connected to the transistor TFT of the pixel circuit PC through the first connection electrode CM1, the second connection electrode CM2, and the third connection electrode CM3.

The pixel electrode 310 may be a (semi) transmissive electrode or a reflective electrode. In some embodiments, the pixel electrode 310 may include a reflective layer including Ag, Mg, Al, Pt, Pd, Au, Ni, Nd, Ir, Cr, or a suitable compound thereof, and a transparent or translucent electrode layer formed on the reflective layer. The transparent or translucent electrode layer may include at least one selected from the group consisting of ITO, IZO, ZnO, $In_2O_3$, IGO, and AZO. In some embodiments, the pixel electrode 310 may include ITO/Ag/ITO.

In a display area of the substrate 200, a pixel-defining layer 217 may be disposed on the third planarization layer 216. The pixel-defining layer 217 may cover an edge of the pixel electrode 310, and may include an opening exposing a central portion of the pixel electrode 310. An emission area of the display element 300 may be defined by the opening. The pixel-defining layer 217 may increase a distance between the edge of the pixel electrode 310 and the opposite electrode 330 above the pixel electrode 310, to thereby prevent or substantially prevent an arc and/or the like from occurring at the edge of the pixel electrode 310.

The pixel-defining layer 217 may include one or more organic insulating materials selected from the group consisting of polyimide, polyamide, acrylic resin, BCB, and phenol resin, and may be formed by spin coating or the like.

The intermediate layer 320 may be arranged in the opening formed in (e.g., penetrating) the pixel-defining layer 217, and may include the organic emission layer. The organic emission layer may include an organic material including a fluorescent or phosphorescent material for emitting red, green, blue, or white light. The organic emission layer may include a low molecular weight organic material or a high molecular weight organic material, and a functional layer, such as a hole transport layer (HTL), a hole injection layer (HIL), an electron transport layer (ETL), and/or an electron injection layer (EIL), may be selectively (e.g., optionally) further disposed below and/or above the organic emission layer.

The opposite electrode 330 may be a transmissive electrode or a reflective electrode. In some embodiments, the opposite electrode 330 may be a transparent or translucent electrode, and may include a metal thin film having a low work function, which includes Li, Ca, LiF/Ca, LiF/Al, Al, Ag, Mg, or a suitable compound thereof. In addition, a transparent conductive oxide (TCO) layer, such as an ITO, IZO, ZnO, or $In_2O_3$ layer, may be further disposed on the metal thin film. The opposite electrode 330 may be disposed over the display area, and may be disposed on the intermediate layer 320 and the pixel-defining layer 217. The opposite electrode 330 may be integrally formed in a plurality of display elements 300, or in other words, a plurality of organic light-emitting diodes, to correspond to a plurality of pixel electrodes 310.

Because each of the organic light-emitting diodes may be easily damaged by moisture and/or oxygen from the outside, an encapsulation layer may cover the organic light-emitting diode to protect the organic light-emitting diode. The encapsulation layer may cover the display area, and may extend to at least a portion of a peripheral area. The encapsulation layer may include a first inorganic encapsulation layer, an organic encapsulation layer, and a second inorganic encapsulation layer. The first inorganic encapsulation layer and the second inorganic encapsulation layer may each include at least one inorganic material selected from among aluminum oxide, titanium oxide, tantalum oxide, hafnium oxide, zinc oxide, silicon oxide, silicon nitride, and/or silicon oxynitride. The organic encapsulation layer may include a polymer-based material. Examples of the polymer-based material may include acrylic resin, epoxy-based resin, polyimide, polyethylene, and/or the like. In an embodiment, the organic encapsulation layer may include an acrylate.

Figure 4:
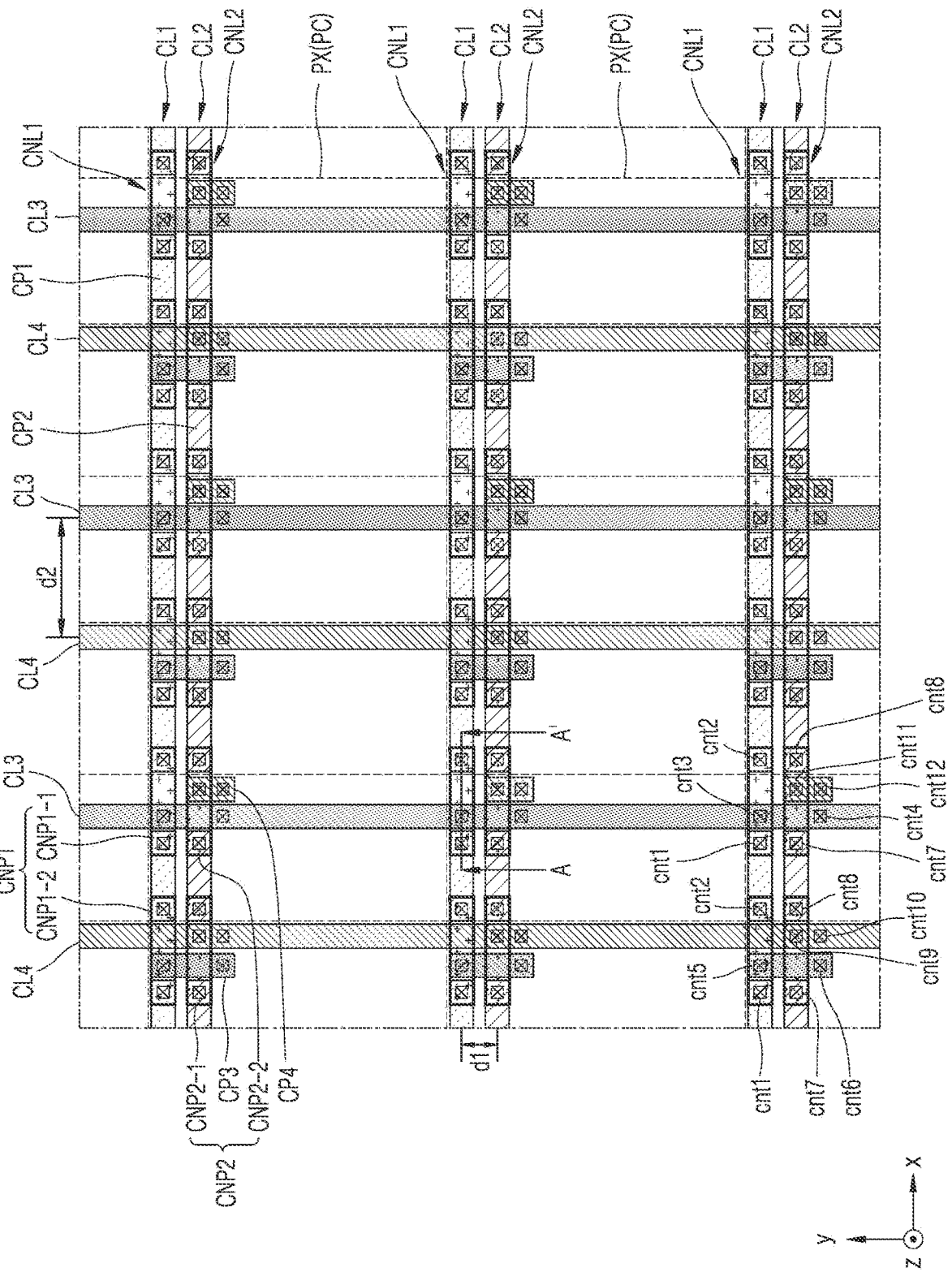
FIG. 4 is a schematic enlarged plan view of a display apparatus according to an embodiment.

FIG. 4 is a schematic enlarged plan view of a display apparatus according to an embodiment.

Referring to FIG. 4, the display apparatus may include the pixels PX, first to fourth conductive lines CL1, CL2, CL3, and CL4, and first and second connection lines CNL1 and CNL2.

The pixels PX may be arranged along a first direction (e.g., a ±x direction), and along a second direction (e.g., a ±y direction). The pixels PX may be arranged in a matrix. As described above with reference to FIG. 2, each of the pixels PX includes a pixel circuit PC, and thus, it may be understood that the pixel circuits PC of the pixels PX are arranged along the first direction (e.g., the ±x direction), and along the second direction (e.g., the ±y direction). It may be understood that the pixel circuits PC are arranged in a matrix.

The first conductive line CL1 may extend in the first direction (e.g., the ±x direction), and may include first conductive patterns CP1 that are spaced apart from each other. The second conductive line CL2 may extend in the first direction (e.g., the ±x direction), and may include second conductive patterns CP2 that are spaced apart from each other. The third conductive line CL3 may extend in the second direction (e.g., the ±y direction). The fourth conductive line CL4 may extend in the second direction (e.g., the ±y direction).

In an embodiment, a plurality of first conductive lines CL1 and a plurality of second conductive lines CL2 may be alternately arranged with each other along the second direction (e.g., the ±y direction). A plurality of third conductive lines CL3 and a plurality of fourth conductive lines CL4 may be alternately arranged with each other along the first direction (e.g., the ±x direction).

In an embodiment, the first conductive lines CL1 and the second conductive lines CL2 may each be arranged at (e.g., in or on) a corresponding pixel row (or a corresponding pixel circuit row). The third conductive lines CL3 and the fourth conductive lines CL4 may each be arranged at (e.g., in or on) every two corresponding pixel columns (or every two corresponding pixel circuit columns). The third conductive lines CL3 and the fourth conductive lines CL4 may be arranged at (e.g., in or on) different pixel columns (or different pixel circuit columns) from each other.

In an embodiment, a first distance d1 between a first conductive line CL1 and a second conductive line CL2 that are adjacent to each other in the second direction (e.g., the ±y direction) from among the first conductive lines CL1 and the second conductive lines CL2 may be less than a second distance d2 between a third conductive line CL3 and a fourth conductive line CL4 that are adjacent to each other in the first direction (e.g., the ±x direction) from among the third conductive lines CL3 and the fourth conductive lines CL4.

Figure 5:
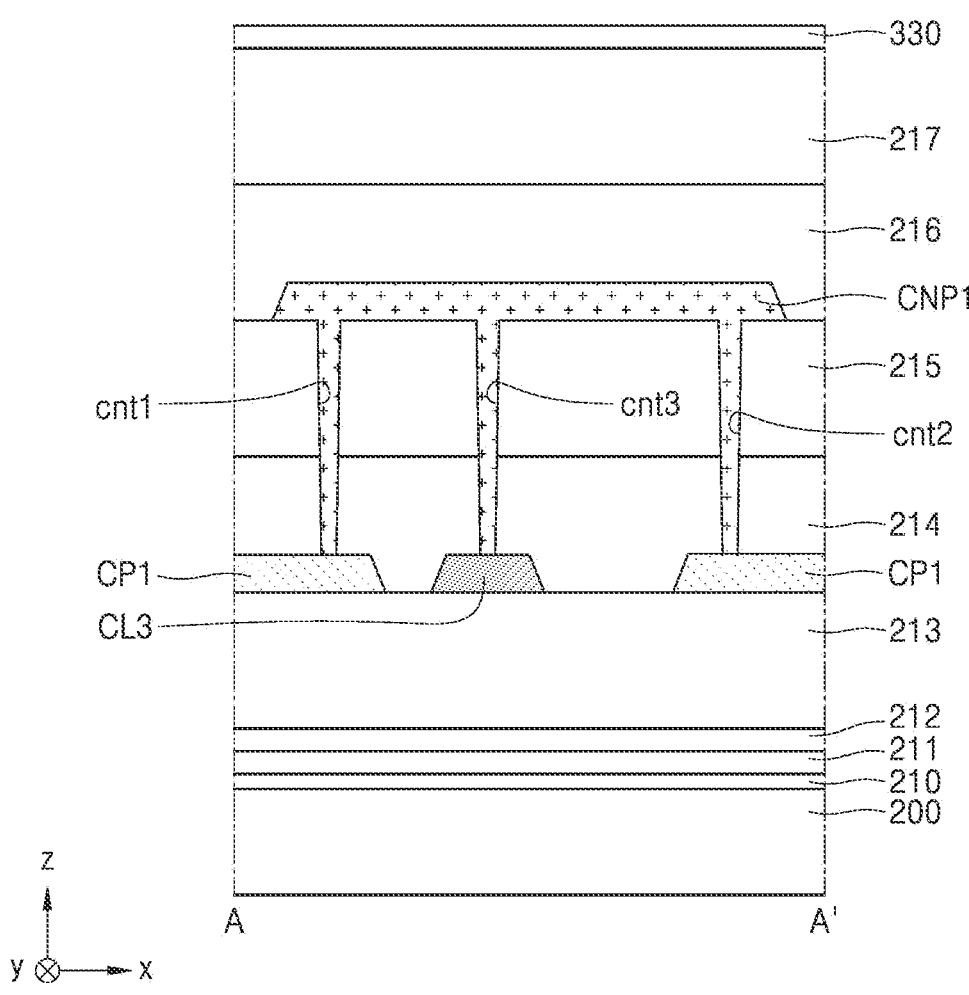
FIG. 5 is a cross-sectional view of a portion of the display apparatus taken along the line A-A' in FIG. 4.
Figure 7:
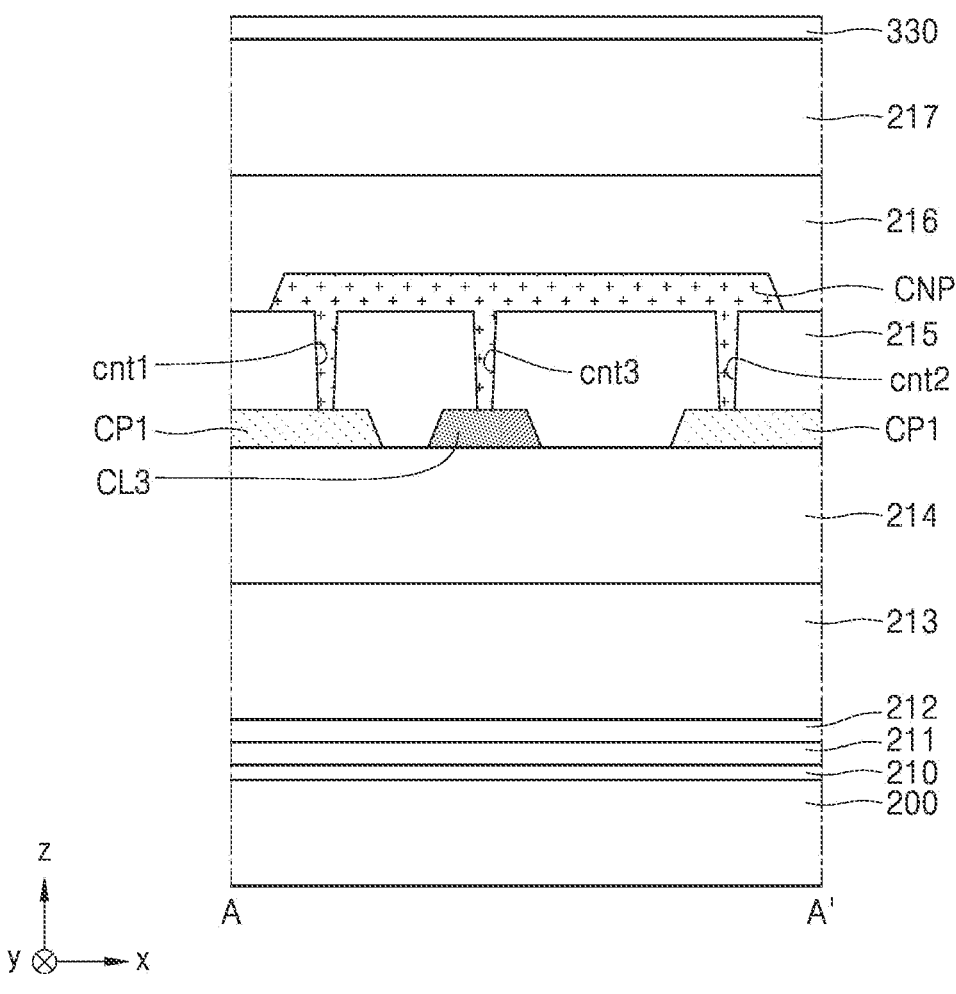
FIG. 7 is a cross-sectional view of a portion of the display apparatus taken along the line A-A' in FIG. 4.

In an embodiment, the first conductive line CL1 and the third conductive line CL3 may be arranged at (e.g., in or on) the same layer as each other. For example, as shown in FIG. 5, which will be described in more detail below, the first conductive pattern CP1 of the first conductive line CL1 and the third conductive line CL3 may be located between an interlayer insulating layer 213 and a first planarization layer 214. As another example, as shown in FIG. 7, which will be described in more detail below, the first conductive pattern CP1 of the first conductive line CL1 and the third conductive line CL3 may be located between the first planarization layer 214 and a second planarization layer 215. Although the first conductive line CL1 and the third conductive line CL3 have been described in more detail as a reference, the same may also be applied to the second conductive line CL2 and the fourth conductive line CL4.

Figure 6:
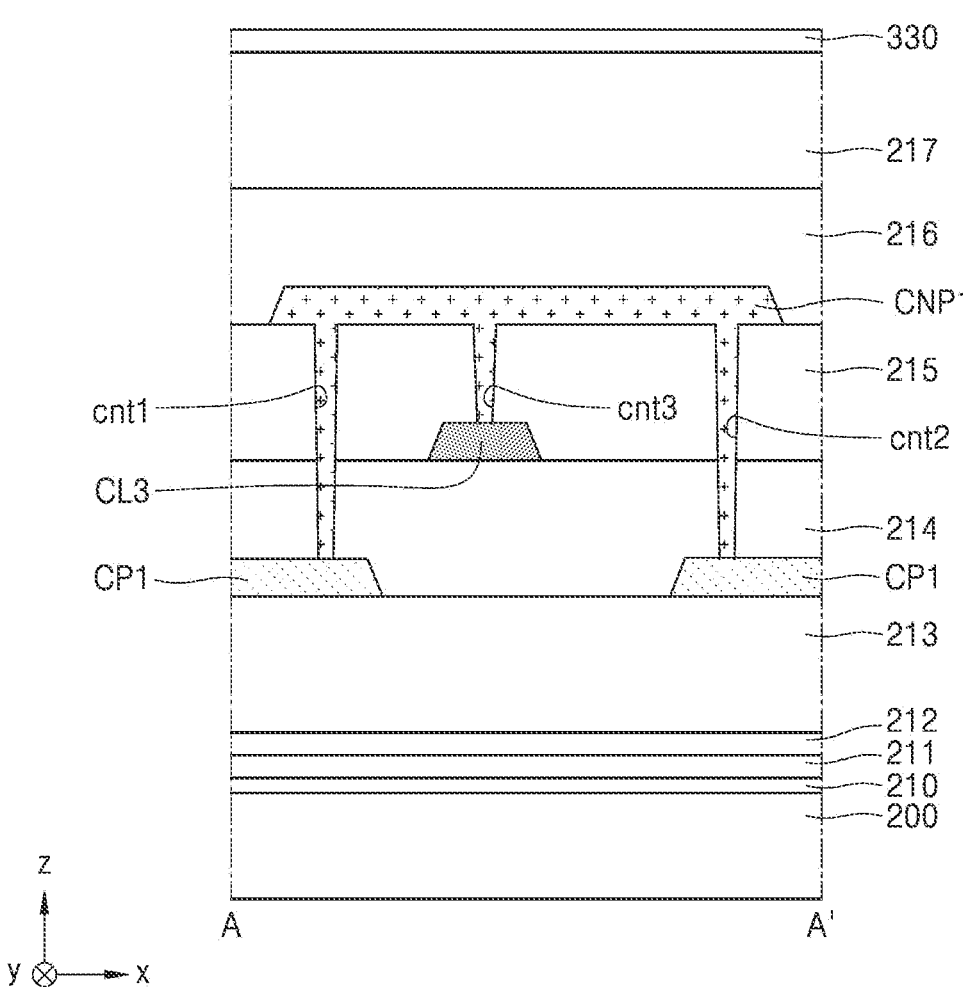
FIG. 6 is a cross-sectional view of a portion of the display apparatus taken along the line A-A' in FIG. 4.
Figure 8:
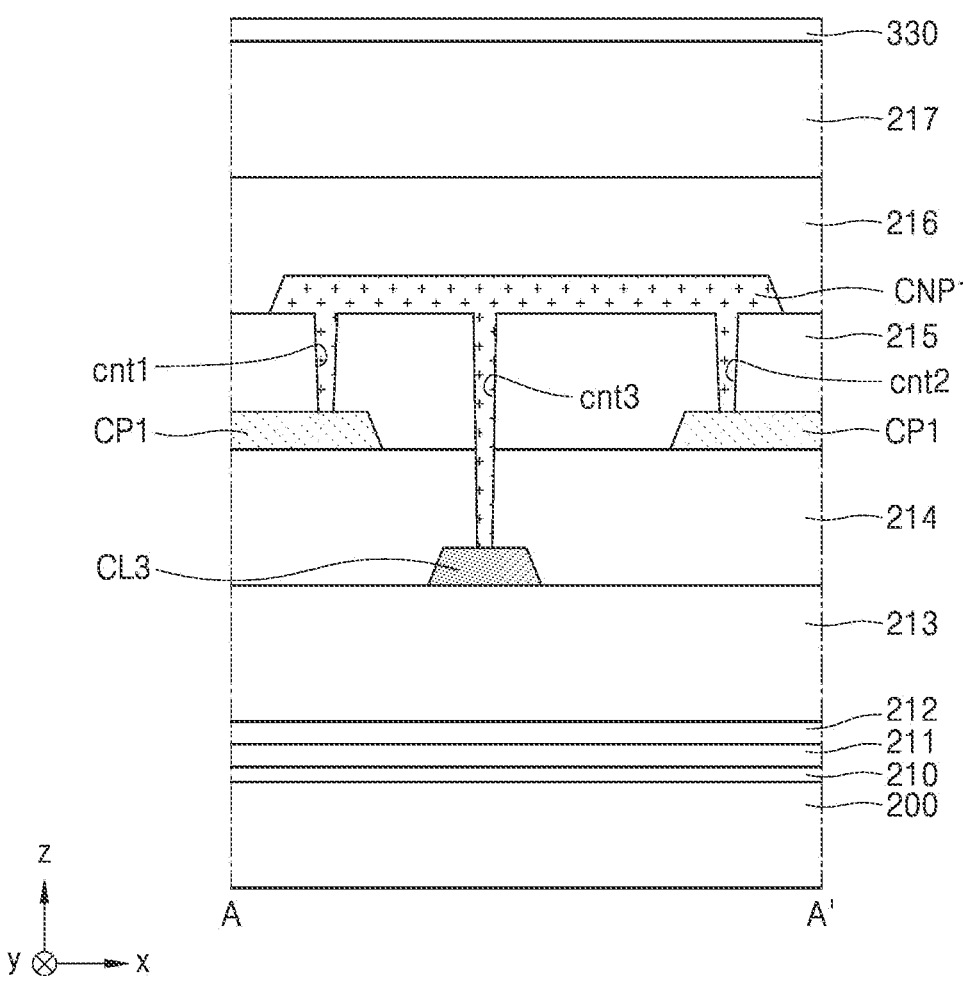
FIG. 8 is a cross-sectional view of a portion of the display apparatus taken along the line A-A' in FIG. 4.

In another embodiment, the first conductive line CL1 and the third conductive line CL3 may be disposed at (e.g., in or on) different layers from each other. For example, as shown in FIG. 6, which will be described in more detail below, the first conductive pattern CP1 of the first conductive line CL1 may be located between the interlayer insulating layer 213 and the first planarization layer 214, and the third conductive line CL3 may be located between the first planarization layer 214 and the second planarization layer 215. As another example, as shown in FIG. 8, which will be described in more detail below, a first conductive pattern CP1 of the first conductive line CL1 may be located between the first planarization layer 214 and the second planarization layer 215, and the third conductive line CL3 may be located between the interlayer insulating layer 213 and the first planarization layer 214. Although the first conductive line CL1 and the third conductive line CL3 have been described in more detail as a reference, the same may also be applied to the second conductive line CL2 and the fourth conductive line CL4.

The first connection line CNL1 may extend in the first direction (e.g., the ±x direction), and may include first connection patterns CNP1 that are spaced apart from each other. The first connection patterns CNP1 may connect the first conductive patterns CP1 of the first conductive line CL1 to each other. One end and another end of the first connection pattern CNP1 may be connected to the first conductive patterns CP1 of the first conductive line CL1 through a first contact hole cnt1 and a second contact hole cnt2, respectively. In a plan view, the first conductive patterns CP1 of the first conductive line CL1 and the first connection patterns CNP1 of the first connection line CNL1 may be alternately arranged with each other along the first direction (e.g., the ±x direction).

The third conductive line CL3 may be connected to the first conductive line CL1 through the first connection line CNL1. The first connection pattern CNP1 (e.g., a first-first connection pattern CNP1-1) of the first connection line CNL1, which connects the first conductive patterns CP1 of the first conductive line CL1 to each other, may be connected to the third conductive line CL3 through a third contact hole cnt3. The first conductive lines CL1, the first connection lines CNL1, and the third conductive lines CL3 that are connected to each other may configure (or form) a mesh structure.

The second connection line CNL2 may extend in the first direction (e.g., the ±x direction), and may include second connection patterns CNP2 that are spaced apart from each other. The second connection patterns CNP2 may connect the second conductive patterns CP2 of the second conductive line CL2 to each other. One end and another end of the second connection pattern CNP2 may be connected to the second conductive patterns CP2 of the second conductive line CL2 through a seventh contact hole cnt7 and an eighth contact hole cnt8, respectively. In a plan view, the second conductive patterns CP2 of the second conductive line CL2 and the second connection patterns CNP2 of the second connection line CNL2 may be alternately arranged with each other along the first direction (e.g., the ±x direction).

The fourth conductive line CL4 may be connected to the second conductive line CL2 through the second connection line CNL2. The second connection pattern CNP2 (e.g., a second-first connection pattern CNP2-1) of the second connection line CNL2, which connects the second conductive patterns CP2 of the second conductive line CL2 to each other, may be connected to the fourth conductive line CL4 through a ninth contact hole cnt9. The second conductive lines CL2, the second connection lines CNL2, and the fourth conductive lines CL4 that are connected to each other may configure (or form) a mesh structure.

The display apparatus may further include third and fourth conductive patterns CP3 and CP4. A longitudinal direction of the third conductive pattern CP3 may be the second direction (e.g., the ±y direction), and the third conductive pattern CP3 may be connected to the first conductive line CL1 through the first connection line CNL1. The first connection pattern CNP1 (e.g., a first-second connection pattern CNP1-2) of the first connection line CNL1, which connects the first conductive patterns CP1 of the first conductive line CL1 to each other, may be connected to the third conductive pattern CP3 through a fifth contact hole cnt5. A longitudinal direction of the fourth conductive pattern CP4 may be the second direction (e.g., the ±y direction), and the fourth conductive pattern CP4 may be connected to the second conductive line CL2 through the second connection line CNL2. The second connection pattern CNP2 (e.g., a second-second connection pattern CNP2-2) of the second connection line CNL2, which connects the second conductive patterns CP2 of the second conductive line CL2 to each other, may be connected to the fourth conductive pattern CP4 through an eleventh contact hole cnt11.

In an embodiment, a plurality of first-first connection patterns CNP1-1, which are some parts of the first connection patterns CNP1, and a plurality of first-second connection patterns CNP1-2, which are some other parts of the first connection patterns CNP1, may be alternately arranged with each other along the first direction (e.g., the ±x direction). A plurality of second-first connection patterns CNP2-1, which are some parts of the second connection patterns CNP2, and a plurality of second-second connection patterns CNP2-2, which are some other parts of the second connection patterns CNP2, may be alternately arranged with each other along the first direction (e.g., the ±x direction).

In an embodiment, the third conductive patterns CP3 and the fourth conductive patterns CP4 may be arranged at (e.g., in or on) every two corresponding pixel columns (or every two corresponding pixel circuit columns). The third conductive patterns CP3 and the fourth conductive patterns CP4 may be arranged at (e.g., in or on) different pixel columns (or different pixel circuit columns) from each other.

In an embodiment, the third conductive lines CL3 and the third conductive patterns CP3 may be arranged at (e.g., in or on) different pixel columns (or different pixel circuit columns) from each other. The fourth conductive lines CL4 and the fourth conductive patterns CP4 may be arranged at (e.g., in or on) different pixel columns (or different pixel circuit columns) from each other. The third conductive lines CL3 and the fourth conductive patterns CP4 may be arranged at (e.g., in or on) the same pixel column (or the same pixel circuit column) as each other. The fourth conductive lines CL4 and the third conductive patterns CP3 may be arranged at (e.g., in or on) the same pixel column (or the same pixel circuit column) as each other.

In an embodiment, the first conductive line CL1 may be configured to transfer a first voltage (e.g., the first initialization voltage VINT1 of FIG. 2) to the pixels PX. For example, some of the pixels PX may be connected to the third conductive line CL3 that is connected to the first conductive line CL1 through a fourth contact hole cnt4, and may receive the first voltage. Some other pixels PX may be connected to the third conductive pattern CP3 that is connected to the first conductive line CL1 through the sixth contact hole cnt6, and may receive the first voltage.

In an embodiment, the second conductive line CL2 transmits a second voltage (e.g., the second initialization voltage VINT2 of FIG. 2) having a different level than that of the first voltage to the pixels PXs. For example, some pixels PX may be connected to the fourth conductive line CL4 that is connected to the second conductive line CL2 through the tenth contact hole cnt10, and may receive the second voltage. Some other pixels PX may be connected to the fourth conductive pattern CP4 that is connected to the second conductive line CL2 through a twelfth contact hole cnt12, and may receive the second voltage.

In an embodiment, a transmittance of the first connection line CNL1 may be greater than a transmittance of the first conductive line CL1. For example, the first connection line CNL1 may include a transparent conductive material. The first connection line CNL1 may include a TCO. The first connection line CNL1 may include a conductive oxide, such as ITO, IZO, ZnO, $In_2O_3$, IGO, or AZO. The first conductive line CL1 may include a conductive material including Mo, Al, Cu, Ti, or the like, and may include multiple layers or a single layer including one or more of the conductive materials. For example, the first conductive line CL1 may have a multi-layered structure including Ti/Al/Ti layers. Although the first connection line CNL1 and the first conductive line CL1 have been described in more detail as a reference, the same may also be applied to the second connection line CNL2 and the second conductive line CL2.

In an embodiment, the first connection line CNL1 may be disposed on the first conductive line CL1. For example, as shown in FIG. 5, which will be described in more detail below, a first connection pattern CNP1 of the first connection line CNL1 may be located between the second planarization layer 215 and the third planarization layer 216, and the first conductive pattern CP1 of the first conductive line CL1 may be located between the interlayer insulating layer 213 and the first planarization layer 214. Although the first connection line CNL1 and the first conductive line CL1 have been described as a reference, the same may also be applied to the second connection line CNL2 and the second conductive line CL2.

As in the above-described embodiments, when the first conductive patterns CP1 of the first conductive line CL1, which are spaced apart from each other, are connected to each other through the first connection patterns CNP1 of the first connection line CNL1 disposed at (e.g., in or on) a layer that is different from that of the first conductive line CL1, the proportion of a conductive layer (or a conductive material) constituting the first conductive line CL1 in the display apparatus may be reduced when compared to when the first conductive line CL1 continuously extends. The pixels PX may be further arranged in the display apparatus by reducing the conductive layer (or the conductive material) constituting the first conductive line CL1. The resolution of the display apparatus may be improved. A high-resolution display apparatus may be implemented.

FIG. 5 is a cross-sectional view of a portion of the display apparatus taken along the line A-A' in FIG. 4. In FIG. 5, the same reference numerals are used to refer to the same or substantially the same members as those illustrated in FIG. 3, and thus, redundant description thereof may not be repeated.

Referring to FIG. 5, the first conductive patterns CP1 of the first conductive line CL1 (e.g., see FIG. 4), and the third conductive line CL3 may be located between the interlayer insulating layer 213 and the first planarization layer 214. The first connection pattern CNP1 of the first connection line CNL1 (e.g., see FIG. 4) may be located between the second planarization layer 215 and the third planarization layer 216.

FIG. 5 illustrates an example in which the second planarization layer 215 is located between the first planarization layer 214 and the third planarization layer 216. However, in another embodiment, the second planarization layer 215 may be omitted as needed or desired.

The first conductive patterns CP1 and the third conductive line CL3 may each include a conductive material including Mo, Al, Cu, Ti, or the like, and may include multiple layers or a single layer including one or more of the conductive materials. For example, the first conductive patterns CP1 and the third conductive line CL3 may each have a multi-layered structure including Ti/Al/Ti layers. The first connection pattern CNP1 may include a TCO. The first connection pattern CNP1 may include a conductive oxide, such as ITO, IZO, ZnO, $In_2O_3$, IGO, or AZO.

One end and another end of the first connection pattern CNP1 may be connected to the first conductive patterns CP1 through the first contact hole cnt1 and the second contact hole cnt2, respectively. The first contact hole cnt1 and the second contact hole cnt2 may be formed in (e.g., may penetrate) the first planarization layer 214 and the second planarization layer 215. The first connection pattern CNP1 (e.g., the first-first connection pattern CNP1-1 of FIG. 4) may be connected to the third conductive line CL3 through the third contact hole cnt3. The third contact hole cnt3 may be formed in (e.g., may penetrate) the first planarization layer 214 and the second planarization layer 215.

Although the first conductive pattern CP1, the first connection pattern CNP1, and the third conductive line CL3 have been described in more detail as a reference, the same may also be applied to the second conductive pattern CP2, the second connection pattern CNP2, the fourth conductive line CL4, the third conductive pattern CP3, and the fourth conductive pattern CP4. For example, the third conductive pattern CP3 may be disposed at (e.g., in or on) the same layer as that of the third conductive line CL3.

FIG. 6 is a cross-sectional view of a portion of the display apparatus taken along the line A-A' in FIG. 4. In FIG. 6, the same reference numerals are used to refer to the same or substantially the same members as those illustrated in FIG. 3, and thus, redundant description thereof may not be repeated.

Referring to FIG. 6, the first conductive patterns CP1 of the first conductive line CL1 (e.g., see FIG. 4) may be located between the interlayer insulating layer 213 and the first planarization layer 214, and the third conductive line CL3 may be located between the first planarization layer 214 and the second planarization layer 215. The first connection pattern CNP1 of the first connection line CNL1 (e.g., see FIG. 4) may be located between the second planarization layer 215 and the third planarization layer 216.

The first conductive patterns CP1 and the third conductive line CL3 may each include a conductive material including Mo, Al, Cu, Ti, or the like, and may include multiple layers or a single layer including one or more of the conductive materials. For example, the first conductive patterns CP1 and the third conductive line CL3 may each have a multi-layered structure including Ti/Al/Ti layers. The first connection pattern CNP1 may include a TCO. The first connection pattern CNP1 may include a conductive oxide, such as ITO, IZO, ZnO, $In_2O_3$, IGO, or AZO.

One end and another end of the first connection pattern CNP1 may be connected to the first conductive patterns CP1 through the first contact hole cnt1 and the second contact hole cnt2, respectively. The first contact hole cnt1 and the second contact hole cnt2 may be formed in (e.g., may penetrate) the first planarization layer 214 and the second planarization layer 215. The first connection pattern CNP1 (e.g., the first-first connection pattern CNP1-1 of FIG. 4) may be connected to the third conductive line CL3 through the third contact hole cnt3. The third contact hole cnt3 may be formed in (e.g., may penetrate) the second planarization layer 215.

Although the first conductive pattern CP1, the first connection pattern CNP1, and the third conductive line CL3 have been described in more detail as a reference, the same may also be applied to the second conductive pattern CP2, the second connection pattern CNP2, the fourth conductive line CL4, the third conductive pattern CP3, and the fourth conductive pattern CP4. For example, the third conductive pattern CP3 may be disposed at (e.g., in or on) the same layer as that of the third conductive line CL3.

FIG. 7 is a cross-sectional view of a portion of the display apparatus taken along the line A-A' in FIG. 4. In FIG. 7, the same reference numerals are used to refer to the same or substantially the same members as those illustrated in FIG. 3, and thus, redundant description thereof may not be repeated.

Referring to FIG. 7, the first conductive patterns CP1 of the first conductive line CL1 (e.g., see FIG. 4) and the third conductive line CL3 may be located between the first planarization layer 214 and the second planarization layer 215. The first connection pattern CNP1 of the first connection line CNL1 (e.g., see FIG. 4) may be located between the second planarization layer 215 and the third planarization layer 216.

The first conductive patterns CP1 and the third conductive line CL3 may each include a conductive material including Mo, Al, Cu, Ti, or the like, and may include multiple layers or a single layer including one or more of the conductive materials. For example, the first conductive patterns CP1 and the third conductive line CL3 may each have a multi-layered structure including Ti/Al/Ti layers. The first connection pattern CNP1 may include a TCO. The first connection pattern CNP1 may include a conductive oxide, such as ITO, IZO, ZnO, In₂O₃, IGO, or AZO.

One end and another end of the first connection pattern CNP1 may be connected to the first conductive patterns CP1 through the first contact hole cnt1 and the second contact hole cnt2, respectively. The first contact hole cnt1 and the second contact hole cnt2 may be formed in (e.g., may penetrate) the second planarization layer 215. The first connection pattern CNP1 (e.g., the first-first connection pattern CNP1-1 of FIG. 4) may be connected to the third conductive line CL3 through the third contact hole cnt3. The third contact hole cnt3 may be formed in (e.g., may penetrate) the second planarization layer 215.

Although the first conductive pattern CP1, the first connection pattern CNP1, and the third conductive line CL3 have been described in more detail as a reference, the same may also be applied to the second conductive pattern CP2, the second connection pattern CNP2, the fourth conductive line CL4, the third conductive pattern CP3, and the fourth conductive pattern CP4. For example, the third conductive pattern CP3 may be disposed at (e.g., in or on) the same layer as that of the third conductive line CL3.

FIG. 8 is a cross-sectional view of a portion of the display apparatus taken along the line A-A' in FIG. 4. In FIG. 8, the same reference numerals are used to refer to the same or substantially the same members as those illustrated in FIG. 3, and thus, redundant description thereof may not be repeated.

Referring to FIG. 8, the first conductive patterns CP1 of the first conductive line CL1 (e.g., see FIG. 4) may be located between the first planarization layer 214 and the second planarization layer 215, and the third conductive line CL3 may be located between the interlayer insulating layer 213 and the first planarization layer 214. The first connection pattern CNP1 of the first connection line CNL1 (e.g., see FIG. 4) may be located between the second planarization layer 215 and the third planarization layer 216.

The first conductive patterns CP1 and the third conductive line CL3 may each include a conductive material including Mo, Al, Cu, Ti, or the like, and may include multiple layers or a single layer including one or more of the conductive materials. For example, the first conductive patterns CP1 and the third conductive line CL3 may each have a multi-layered structure including Ti/Al/Ti layers. The first connection pattern CNP1 may include a TCO. The first connection pattern CNP1 may include a conductive oxide, such as ITO, IZO, ZnO, In₂O₃, IGO, or AZO.

One end and another end of the first connection pattern CNP1 may be connected to the first conductive patterns CP1 through the first contact hole cnt1 and the second contact hole cnt2, respectively. The first contact hole cnt1 and the second contact hole cnt2 may be formed in (e.g., may penetrate) the second planarization layer 215. The first connection pattern CNP1 (e.g., the first-first connection pattern CNP1-1 of FIG. 4) may be connected to the third conductive line CL3 through the third contact hole cnt3. The third contact hole cnt3 may be formed in (e.g., may penetrate) the first planarization layer 214 and the second planarization layer 215.

Although the first conductive pattern CP1, the first connection pattern CNP1, and the third conductive line CL3 have been described in more detail as a reference, the same may also be applied to the second conductive pattern CP2, the second connection pattern CNP2, the fourth conductive line CL4, the third conductive pattern CP3, and the fourth conductive pattern CP4. For example, the third conductive pattern CP3 may be disposed at (e.g., in or on) the same layer as that of the third conductive line CL3.

Figure 9:
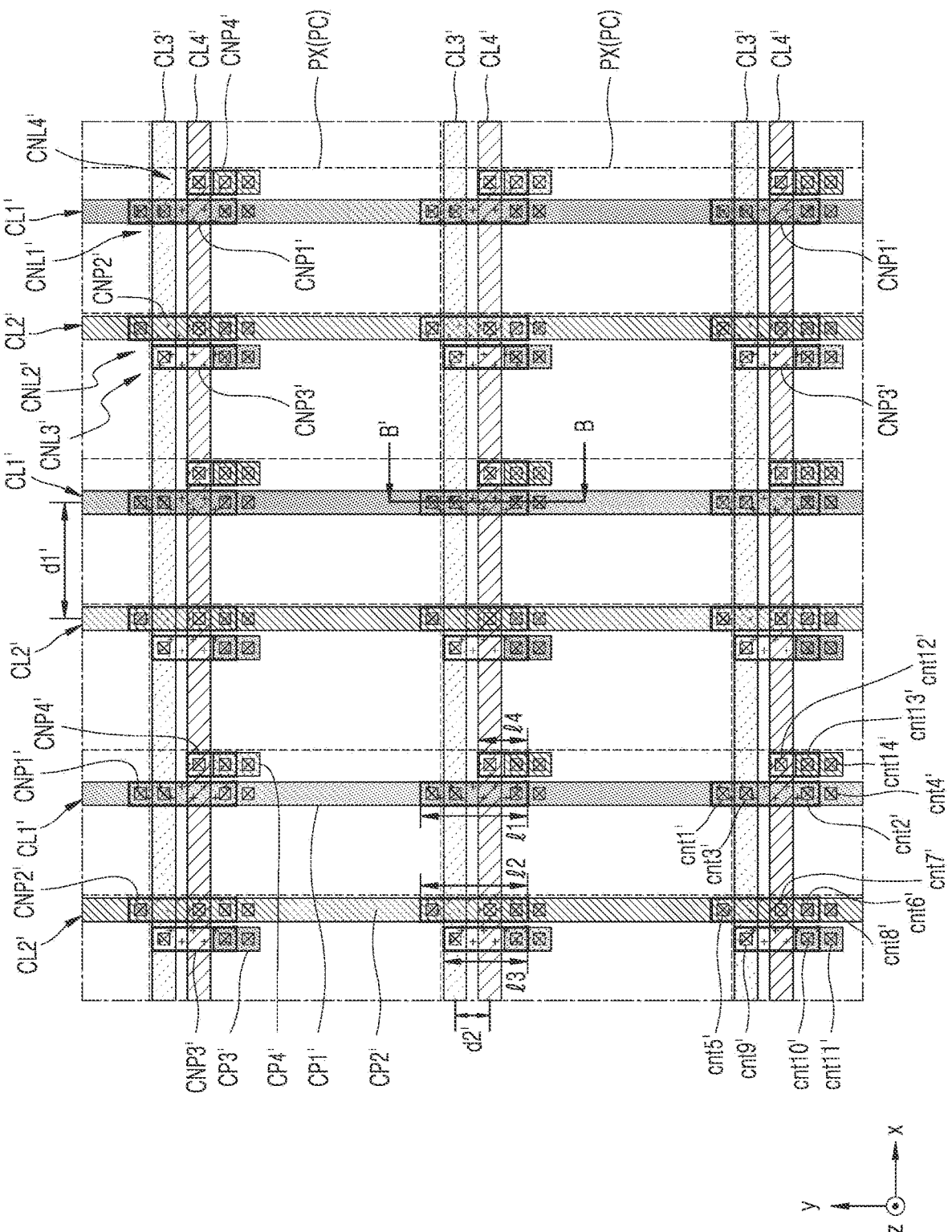
FIG. 9 is a schematic enlarged plan view of a display apparatus according to an embodiment.

FIG. 9 is a schematic enlarged plan view of a display apparatus according to an embodiment.

Referring to FIG. 9, the display apparatus may include the pixels PX, first to fourth conductive lines CL1', CL2', CL3', and CL4', and first to fourth connection lines CNL1', CNL2', CNL3', and CNL4'.

The pixels PX may be arranged along a first direction (e.g., a ±x direction), and along a second direction (e.g., a ±y direction). The pixels PX may be arranged in a matrix. As described above with reference to FIG. 2, each of the pixels PX includes a pixel circuit PC, and thus, it may be understood that the pixel circuits PC of the pixels PX are arranged along the first direction (e.g., the ±x direction), and along the second direction (e.g., the ±y direction). It may be understood that the pixel circuits PC are arranged in a matrix.

The first conductive line CL1' may extend in the second direction (e.g., the ±y direction), and may include first conductive patterns CP1' that are spaced apart from each other. The second conductive line CL2' may extend in the second direction (e.g., the ±y direction), and may include second conductive patterns CP2' that are spaced apart from each other. The third conductive line CL3' may extend in the first direction (e.g., the ±x direction). The fourth conductive line CL4' may extend in the first direction (e.g., the ±x direction).

In an embodiment, the first conductive lines CL1' and the second conductive lines CL2' may be alternately arranged with each other along the first direction (e.g., the ±x direction). The third conductive lines CL3' and the fourth conductive lines CL4' may be alternately arranged with each other along the second direction (e.g., the ±y direction).

In an embodiment, the first conductive lines CL1' and the second conductive lines CL2' may each be arranged at (e.g., in or on) every two corresponding pixel columns (or every two corresponding pixel circuit columns). The third conductive lines CL3' and the fourth conductive lines CL4' may each be arranged at (e.g., in or on) each corresponding pixel row (or each corresponding pixel circuit row). The first conductive lines CL1' and the second conductive lines CL2' may be arranged at (e.g., in or on) different pixel columns (or different pixel circuit columns) from each other.

In an embodiment, a first distance d1' between a first conductive line CL1' and a second conductive line CL2' that are adjacent to each other in the first direction (e.g., the ±x direction) from among the first conductive lines CL1' and the second conductive lines CL2' may be less than a second distance d2' between a third conductive line CL3' and a fourth conductive line CL4' that are adjacent to each other in the second direction (e.g., the ±y direction) from among the third conductive lines CL3' and the fourth conductive lines CL4'.

In an embodiment, the first conductive line CL1' and the third conductive line CL3' may be arranged at (e.g., in or on) the same layer as each other. For example, the first conductive line CL1' and the third conductive line CL3' may be located between the interlayer insulating layer 213 (e.g., see FIG. 5) and the first planarization layer 214. As another example, the first conductive line CL1' and the third conductive line CL3' may be located between the first planarization layer 214 and the second planarization layer 215 (e.g., see FIG. 5). Although the first conductive line CL1' and the third conductive line CL3' have been described in more detail as a reference, the same may also be applied to the second conductive line CL2' and the fourth conductive line CL4'.

In another embodiment, the first conductive line CL1' and the third conductive line CL3' may be disposed at (e.g., in or on) different layers from each other. For example, the first conductive line CL1' may be located between the interlayer insulating layer 213 and the first planarization layer 214, and the third conductive line CL3' may be located between the first planarization layer 214 and the second planarization layer 215. As another example, the first conductive line CL1' may be located between the first planarization layer 214 and the second planarization layer 215, and the third conductive line CL3' may be located between the interlayer insulating layer 213 and the first planarization layer 214. Although the first conductive line CL1' and the third conductive line CL3' have been described in more detail as a reference, the same may also be applied to the second conductive line CL2' and the fourth conductive line CL4'.

The first connection line CNL1' may extend in the second direction (e.g., ±y direction), and may include first connection patterns CNP1' that are spaced apart from each other. The first connection patterns CNP1' may connect the first conductive patterns CP1' of the first conductive line CL1' to each other. One end and another end of the first connection pattern CNP1' may be connected to the first conductive patterns CP1' of the first conductive line CL1' through a first contact hole cnt1' and a second contact hole cnt2', respectively. In a plan view, the first conductive patterns CP1' of the first conductive line CL1' and the first connection patterns CNP1' of the first connection line CNL1' may be alternately arranged with each other along the second direction (e.g., the ±y direction).

The third conductive line CL3' may be connected to the first conductive line CL1' through the first connection line CNL1'. The first connection pattern CNP1' of the first connection line CNL1', which connects the first conductive patterns CP1' of the first conductive line CL1' to each other, may be connected to the third conductive line CL3' through a third contact hole cnt3'. The first conductive lines CL1', the first connection lines CNL1', and the third conductive lines CL3' that are connected to each other may configure (or form) a mesh structure.

The second connection line CNL2' may extend in the second direction (e.g., the ±y direction), and may include second connection patterns CNP2' that are spaced apart from each other. The second connection patterns CNP2' may connect the second conductive patterns CP2' of the second conductive line CL2' to each other. One end and another end of the second connection pattern CNP2' may be connected to the second conductive patterns CP2' of the second conductive line CL2' through a fifth contact hole cnt5' and a sixth contact hole cnt6', respectively. In a plan view, the second conductive patterns CP2' of the second conductive line CL2' and the second connection patterns CNP2' of the second connection line CNL2' may be alternately arranged with each other along the second direction (e.g., the ±y direction).

The fourth conductive line CL4' may be connected to the second conductive line CL2' through the second connection line CNL2'. The second connection pattern CNP2' of the second connection line CNL2', which connects the second conductive patterns CP2' of the second conductive line CL2' to each other, may be connected to the fourth conductive line CL4' through a seventh contact hole cnt7'. The second conductive lines CL2', the second connection lines CNL2', and the fourth conductive lines CL4' that are connected to each other may configure (or form) a mesh structure.

The third connection line CNL3' may extend in the second direction (e.g., the ±y direction), and may include third connection patterns CNP3' that are spaced apart from each other. The fourth connection line CNL4' may extend in the second direction (e.g., the ±y direction), and may include fourth connection patterns CNP4' that are spaced apart from each other.

The display apparatus may further include third and fourth conductive patterns CP3' and CP4'.

The third conductive pattern CP3' may be connected to the third conductive line CL3' through the third connection pattern CNP3' of the third connection line CNL3'. One end of the third connection pattern CNP3' may be connected to the third conductive line CL3' through a ninth contact hole cnt9', and another end of the third connection pattern CNP3' may be connected to the third conductive pattern CP3' through a tenth contact hole cnt10'. In a plan view, the third conductive patterns CP3' and the third connection patterns CNP3' may be alternately arranged with each other along the second direction (e.g., the ±y direction).

The fourth conductive pattern CP4' may be connected to the fourth conductive line CL4' through the fourth connection pattern CNP4' of the fourth connection line CNL4'. One end of the fourth connection pattern CNP4' may be connected to the fourth conductive line CL4' through a twelfth contact hole cnt12', and another end of the fourth connection pattern CNP4' may be connected to the fourth conductive pattern CP4' through a thirteenth contact hole cnt13'. In a plan view, the fourth conductive patterns CP4' and the fourth connection patterns CNP4' may be alternately arranged with each other along the second direction (e.g., the ±y direction).

In an embodiment, the third conductive patterns CP3' and the fourth conductive patterns CP4' may each be arranged at (e.g., in or on) every two corresponding pixel columns (or every two corresponding pixel circuit columns). The third conductive patterns CP3' and the fourth conductive patterns CP4' may be arranged at (e.g., in or on) different pixel columns (or different pixel circuit columns) from each other.

In an embodiment, the first conductive lines CL1' and the third conductive patterns CP3' may be arranged at (e.g., in or on) different pixel columns (or different pixel circuit columns) from each other. The second conductive lines CL2' and the fourth conductive patterns CP4' may be arranged at (e.g., in or on) different pixel columns (or different pixel circuit columns) from each other. The first conductive lines CL1' and the fourth conductive patterns CP4' may be arranged at (e.g., in or on) the same pixel column (or the same pixel circuit column) as each other. The second conductive lines CL2' and the third conductive patterns CP3' may be arranged at (e.g., in or on) the same pixel column (or the same pixel circuit column) as each other.

In an embodiment, the first connection patterns CNP1' and the third connection patterns CNP3' may be arranged at (e.g., in or on) different pixel columns (or different pixel circuit columns) from each other. The second connection patterns CNP2' and the fourth connection patterns CNP4' may be arranged at (e.g., in or on) different pixel columns (or different pixel circuit columns) from each other. The first connection patterns CNP1' and the fourth connection patterns CNP4' may be arranged at (e.g., in or on) the same pixel column (or the same pixel circuit column) as each other. The second connection patterns CNP2' and the third connection patterns CNP3' may be arranged at (e.g., in or on) the same pixel column (or the same pixel circuit column) as each other.

In an embodiment, a length $\ell 1$ of each of the first connection patterns CNP1' in the second direction (e.g., the ±y direction) may be greater than a length $\ell 3$ of each of the third connection patterns CNP3' in the second direction (e.g., the ±y direction). A length $\ell 2$ of each of the second connection patterns CNP2' in the second direction (e.g., the ±y direction) may be greater than a length ℓ4 of each of the fourth connection patterns CNP4' in the second direction (e.g., the ±y direction).

In an embodiment, the first conductive line CL1' may be configured to transfer a first voltage (e.g., the first initialization voltage VINT1 of FIG. 2) to the pixels PX. For example, some of the pixels PX may be connected to the first conductive line CL1' through a fourth contact hole cnt4', and may receive the first voltage. Some other pixels PX may be connected to the third conductive pattern CP3' connected to the third connection pattern CNP3' through an eleventh contact hole cnt11'. Because the third connection pattern CNP3' is connected to the third conductive line CL3', and the third conductive line CL3' is connected to the first conductive line CL1', the some other pixels PX may receive the first voltage.

In an embodiment, the second conductive line CL2' may transfer a second voltage (e.g., the second initialization voltage VINT2 of FIG. 2), which has a level that is different from that of the first voltage, to the pixels PX. For example, some pixels PX may be connected to the second conductive line CL2' through an eighth contact hole cnt8', and may receive the second voltage. Some other pixels PX may be connected to the fourth conductive pattern CP4' connected to the fourth connection pattern CNP4' through a fourteenth contact hole cnt14'. Because the fourth connection pattern CNP4' is connected to the fourth conductive line CL4', and the fourth conductive line CL4' is connected to the second conductive line CL2', the some other pixels PX may receive the second voltage.

In an embodiment, the transmittance of the first connection line CNL1' may be greater than that of the first conductive line CL1'. For example, the first connection line CNL1' may include a transparent conductive material. The first connection line CNL1' may include a TCO. The first connection line CNL1' may include a conductive oxide, such as ITO, IZO, ZnO, In$_2$O$_3$, IGO, or AZO. The first conductive line CL1' may include a conductive material including Mo, Al, Cu, Ti, or the like, and may include multiple layers or a single layer including one or more of the conductive materials. For example, the first conductive line CL1' may have a multi-layered structure including Ti/Al/Ti layers. Although the first connection line CNL1' and the first conductive line CL1' have been described in more detail as a reference, the same may also be applied to the second connection line CNL2', the second conductive line CL2', the third connection line CNL3', and the fourth connection line CNL4'.

Figure 10:
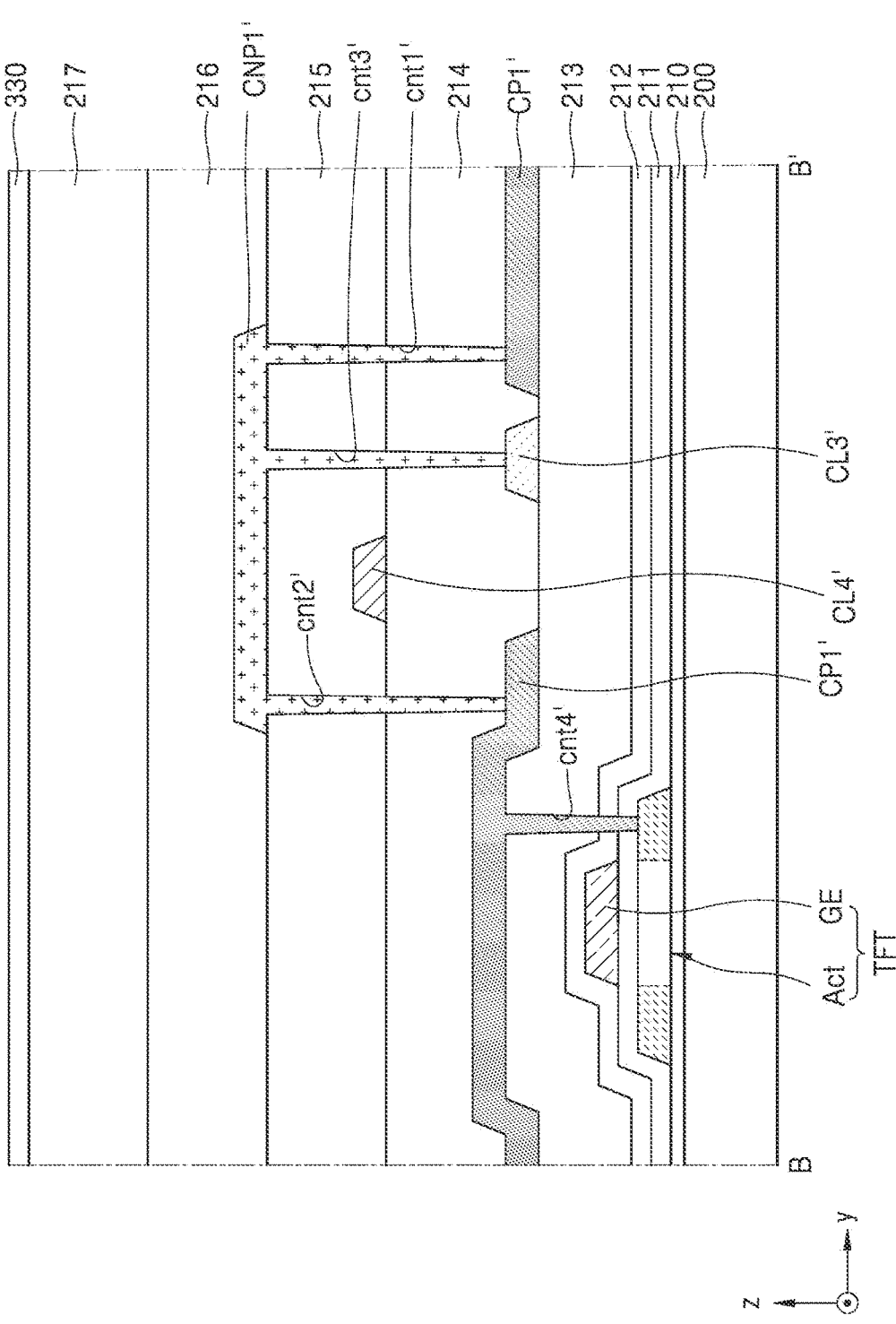
FIG. 10 is a cross-sectional view of a portion of the display apparatus taken along the line B-B' in FIG. 9.

In an embodiment, the first connection line CNL1' may be disposed on the first conductive line CL1'. For example, as shown in FIG. 10, which will be described in more detail below, the first connection pattern CNP1' of the first connection line CNL1' may be located between the second planarization layer 215 and the third planarization layer 216, and the first conductive pattern CP1' of the first conductive line CL1' may be located between the interlayer insulating layer 213 and the first planarization layer 214. Although the first connection line CNL1' and the first conductive line CL1' have been described in more detail as a reference, the same may also be applied to the second connection line CNL2', the second conductive line CL2', the third connection line CNL3', and the fourth connection line CNL4'.

As in one or more of the embodiments described above, when the first conductive patterns CP1' of the first conductive line CL1', which are spaced apart from each other, are connected to each other through the first connection patterns CNP1' of the first connection line CNL1' that is disposed at (e.g., in or on) a layer that is different from that of the first conductive line CL1', the proportion of a conductive layer (or a conductive material) constituting the first conductive line CL1' in the display apparatus may be reduced compared to when the first conductive line CL1' continuously extends. The pixels PX may be further arranged in the display apparatus by reducing the conductive layer (or the conductive material) constituting the first conductive line CL1'. The resolution of the display apparatus may be improved. A high-resolution display apparatus may be implemented.

FIG. 10 is a cross-sectional view of a portion of the display apparatus taken along the line B-B' in FIG. 9. In FIG. 10, the same reference numerals are used to refer to the same or substantially the same members as those illustrated in FIG. 3, and thus, redundant description thereof may not be repeated.

Referring to FIG. 10, the first conductive patterns CP1' of the first conductive line CL1' (e.g., see FIG. 9), and the third conductive line CL3' may be located between the interlayer insulating layer 213 and the first planarization layer 214. The fourth conductive line CL4' may be located between the first planarization layer 214 and the second planarization layer 215. The first connection pattern CNP1' of the first connection line CNL1' (e.g., see FIG. 9) may be located between the second planarization layer 215 and the third planarization layer 216.

The first conductive patterns CP1', the third conductive line CL3', and the fourth conductive line CL4' may each include a conductive material including Mo, Al, Cu, Ti, or the like, and may include multiple layers or a single layer including one or more of the conductive materials. For example, the first conductive patterns CP1', the third conductive line CL3', and the fourth conductive line CL4' may each have a multi-layered structure including Ti/Al/Ti layers. The first connection pattern CNP1' may include a TCO. The first connection pattern CNP1' may include a conductive oxide, such as ITO, IZO, ZnO, In$_2$O$_3$, IGO, or AZO.

One end and another end of the first connection pattern CNP1' may be connected to the first conductive patterns CP1' through the first contact hole cnt1' and the second contact hole cnt2', respectively. The first contact hole cnt1' and the second contact hole cnt2' may be formed in (e.g., may penetrate) the first planarization layer 214 and the second planarization layer 215. The first connection pattern CNP1' may be connected to the third conductive line CL3' through the third contact hole cnt3'. The third contact hole cnt3' may be formed in (e.g., may penetrate) the first planarization layer 214 and the second planarization layer 215.

The first conductive pattern CP1' may be connected to the semiconductor layer Act of the transistor TFT through the fourth contact hole cnt4'. The fourth contact hole cnt4' may be formed in (e.g., may penetrate) the first gate insulating layer 211, the second gate insulating layer 212, and the interlayer insulating layer 213.

FIG. 10 illustrates an example in which the first conductive patterns CP1' and the third conductive line CL3' are located between the interlayer insulating layer 213 and the first planarization layer 214, and the fourth conductive line CL4' is located between the first planarization layer 214 and the second planarization layer 215. However, in another embodiment, the first conductive patterns CP1', the third conductive line CL3', and the fourth conductive line CL4' may be arranged at (e.g., in or on) the same layer as each other. For example, the first conductive patterns CP1', the third conductive line CL3', and the fourth conductive line CL4' may be located between the interlayer insulating layer 213 and the first planarization layer 214. As another example, the first conductive patterns CP1', the third conductive line CL3', and the fourth conductive line CL4' may be located between the first planarization layer 214 and the second planarization layer 215.

In another embodiment, the first conductive patterns CP1' may be located between the interlayer insulating layer 213 and the first planarization layer 214, and the third conductive line CL3' and the fourth conductive line CL4' may be located between the first planarization layer 214 and the second planarization layer 215. As another example, the first conductive patterns CP1' and the fourth conductive line CL4' may be located between the first planarization layer 214 and the second planarization layer 215, and the third conductive line CL3' may be located between the interlayer insulating layer 213 and the first planarization layer 214. As another example, the first conductive patterns CP1' and the third conductive line CL3' may be located between the first planarization layer 214 and the second planarization layer 215, and the fourth conductive line CL4' may be located between the interlayer insulating layer 213 and the first planarization layer 214.

Although the first conductive pattern CP1', the first connection pattern CNP1', the third conductive line CL3', and the fourth conductive line CL4' have been described in more detail as a reference, the same may also be applied to the second conductive pattern CP2', the second connection pattern CNP2', the third conductive pattern CP3', the fourth conductive pattern CP4', the third connection pattern CNP3', and the fourth connection pattern CNP4'. For example, the third conductive pattern CP3' may be disposed at (e.g., in or on) the same layer as that of the first conductive line CL1'.

Figure 11:
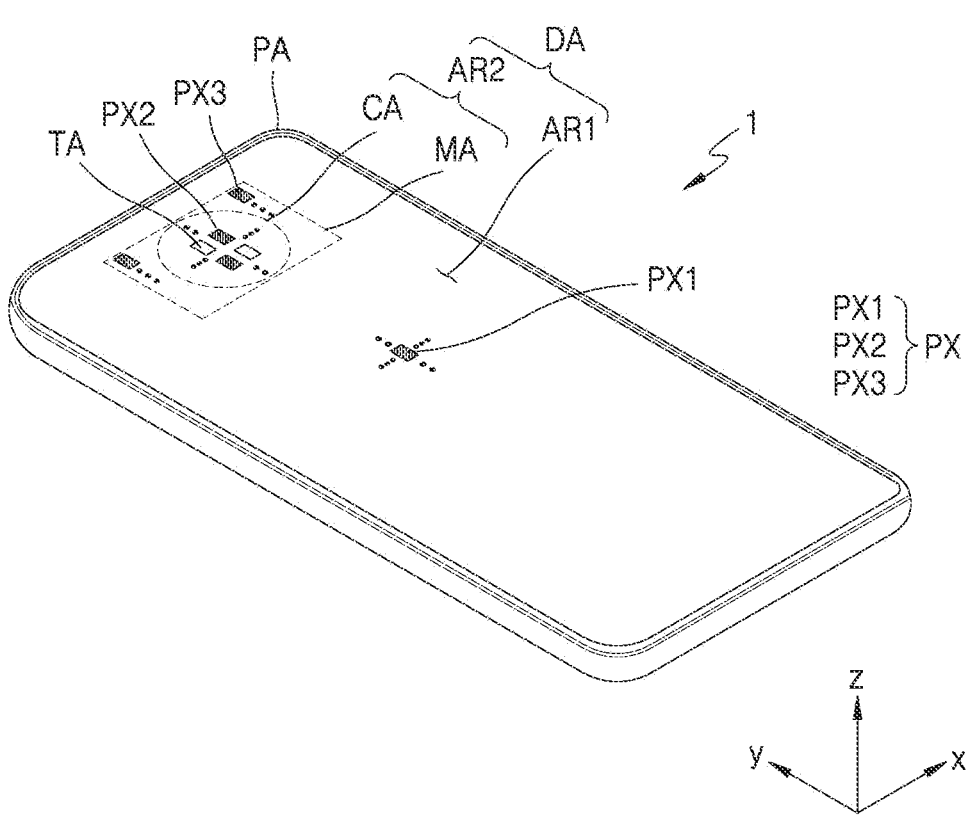
FIG. 11 is a schematic perspective view of a display apparatus according to an embodiment.

FIG. 11 is a schematic perspective view of a display apparatus 1 according to an embodiment.

Referring to FIG. 11, the display apparatus 1 may include a display area DA, and a peripheral area PA outside the display area DA. The display area DA may include a second area AR2, and a first area AR1 that at least partially surrounds (e.g., around a periphery of) the second area AR2. The first area AR1 and the second area AR2 may display an image individually or together. The peripheral area PA may be a type of non-display area, in which display elements are not arranged. The display area DA may be entirely surrounded (e.g., around a periphery thereof) by the peripheral area PA.

The second area AR2 may include a component area CA, and an intermediate area MA that at least partially surrounds (e.g., around a periphery of) the component area CA. The intermediate area MA may be located between the component area CA and the first area AR1. FIG. 11 illustrates an example in which the second area AR2 is located inside (e.g., within) the first area AR1. However, in another embodiment, one side of the second area AR2 may extend and contact the peripheral area PA.

Also, FIG. 11 illustrates an example in which one second area AR2 is located within the first area AR1. In another embodiment, the display apparatus 1 may have two or more second areas AR2, and the shapes and/or sizes of the two or more second areas AR2 may be different from each other. When viewed in a direction that is perpendicular to or substantially perpendicular to the top surface of the display apparatus 1 (e.g., in a plan view), the second area AR2 may have various suitable shapes, such as a polygonal shape, such as a circle, an oval, or a quadrangle, a star shape, a diamond shape, or the like. In addition, FIG. 11 illustrates an example in which the second area AR2 is arranged at the upper center (e.g., in a +y direction) of the first area AR1 having a quadrangular shape or substantially quadrangular shape when viewed in a direction that is perpendicular to or substantially perpendicular to the top surface of the display apparatus 1 (e.g., in a plan view). However, the second area AR2 may be disposed at (e.g., in or on) one side, for example, such as the upper right side or the upper left side, of the first area AR1 that has a quadrangle shape.

The display apparatus 1 may provide an image by using a plurality of pixels PXs arranged at (e.g., in or on) the display area DA. The display apparatus 1 may provide an image by using a plurality of first pixels PX1 arranged at (e.g., in or on) the first area AR1, a plurality of second pixels PX2 arranged at (e.g., in or on) the component area CA of the second area AR2, and a plurality of third pixels PX3 arranged at (e.g., in or on) the intermediate area MA of the second area AR2. The first pixels PX1, the second pixels PX2, and the third pixels PX3 may each include display elements, such as organic light-emitting diodes. Each pixel PX may emit, for example, red, green, blue, or white light through the organic light-emitting diode. The pixels PX may refer to sub-pixels for emitting light of different colors from one another, and each pixel PX may be, for example, one of a red sub-pixel, a green sub-pixel, or a blue sub-pixel.

As described in more detail below with reference to FIG. 12, in the second area AR2, a component 30, which is an electronic element, may be disposed under (e.g., underneath) a display panel to correspond to the component area CA of the second area AR2. The component 30 may be a camera that uses infrared, visible light, and/or the like, and may include an image pickup device. As another example, the component 30 may be a solar cell, a flash, an illuminance sensor, a proximity sensor, or an iris sensor. As another example, the component 30 may have a function of receiving sound. To reduce a limitation of the function of the component 30, the component area CA of the second area AR2 may include a transmission area TA through which light and/or sound output from the component 30 to the outside or traveling toward the component 30 from the outside may be transmitted. In the case of a display panel and a display apparatus including the display panel according to an embodiment, when light is transmitted through the component area CA of the second area AR2, light transmittance may be about 10% or more, or in more detail, about 25% or more, about 40% or more, about 50% or more, about 85% or more, or about 90% or more.

The second pixels PX2 may be arranged at (e.g., in or on) the component area CA of the second area AR2, and the third pixels PX3 may be arranged at (e.g., in or on) the intermediate area MA of the second area AR2. The second pixels PX2 and the third pixels PX3 may emit light to provide a desired image (e.g., a predetermined or certain image). The image displayed at (e.g., in or on) the second area AR2 may be an auxiliary image, and may have a lower resolution than that of an image displayed at (e.g., in or on) the first area AR1.

Because the component area CA of the second area AR2 may include the transmission area TA through which light and/or sound may be transmitted, and the second pixels PX2 are not arranged at (e.g., in or on) the transmission area TA, the number of the second pixels PX2 per unit area may be less than the number of the first pixels PX1 per unit area.

In addition, although the intermediate area MA of the second area AR2 does not include a transmission area TA, some pixel circuits (e.g., the second pixel circuit PC2 of FIG. 12) arranged at (e.g., in or on) the intermediate area MA may be configured to drive the second pixels PX2 at (e.g., in or on) the component area CA, and the number of the third pixels PX3 per unit area may be less than the number of the first pixels PX1 per unit area.

On the other hand, because the resolution may be constant or substantially constant in the second area AR2, the number of the second pixels PX2 per unit area may be the same or substantially the same as the number of the third pixels PX3 per unit area.

Figure 12:
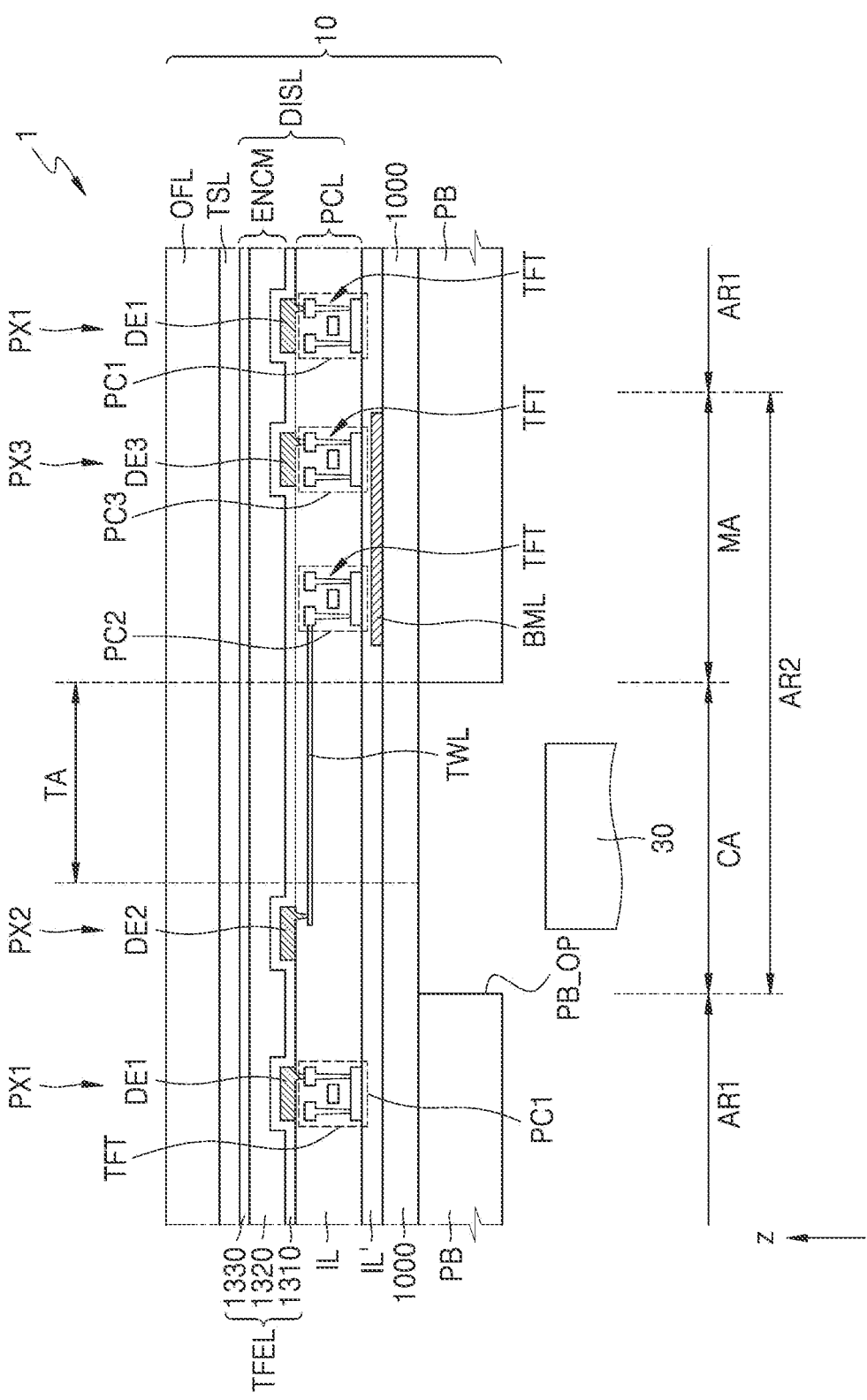
FIG. 12 is a schematic cross-sectional view of a display apparatus according to an embodiment.

FIG. 12 is a schematic cross-sectional view of a display apparatus 1 according to an embodiment.

Referring to FIG. 12, the display apparatus 1 may include a display panel 10, and a component 30 overlapping with the display panel 10. A cover window for protecting the display panel 10 may be further disposed above the display panel 10.

The display panel 10 may include the second area AR2 on which an auxiliary image is displayed, and the first area AR1 on which a main image is displayed. The second area AR2 may include the component area CA that is an area overlapping with the component 30, and the intermediate area MA surrounding (e.g., around a periphery of) the component area CA. The display panel 10 may include a substrate 1000, a display layer DISL on the substrate 1000, and a protection member PB under (e.g., underneath) the substrate 1000. Because the display panel 10 includes the substrate 1000, it may be understood that the second area AR2 and the first area AR1 are defined in the substrate 1000.

The display layer DISL may include a circuit layer PCL including a transistor TFT, a display element layer including first to third display elements DE1, DE2, and DE3, and a sealing member ENCM, such as an encapsulation substrate. An insulating layer IL may be arranged in the display layer DISL, and an insulating layer IL' may be arranged between the substrate 1000 and the display layer DISL.

The substrate 1000 may include an insulating material, such as glass, quartz, or a polymer resin. The substrate 1000 may be a rigid substrate, or a flexible substrate, which is bendable, foldable, or rollable.

The first display element DE1, and a first pixel circuit PC1 connected thereto may be arranged at (e.g., in or on) the first area AR1 of the display panel 10. The first pixel circuit PC1 may include at least one transistor TFT, and may control the operation of the first display element DE1. A first pixel PX1 may be realized by light emission of the first display element DE1.

The second display element DE2 may be arranged at (e.g., in or on) the component area CA of the display panel 10 to implement the second pixel PX2. In the present embodiment, a second pixel circuit PC2 may be arranged to not overlap with the second display element DE2. In other words, the second pixel circuit PC2 for driving the second display element DE2 may not be arranged at (e.g., in or on) the component area CA, and may be arranged at (e.g., in or on) the intermediate area MA between the first area AR1 and the component area CA.

FIG. 12 illustrates an example in which the second pixel circuit PC2 is arranged at (e.g., in or on) the intermediate area MA. However, in another embodiment, the second pixel circuit PC2 may be arranged at (e.g., in or on) the peripheral area PA (e.g., see FIG. 11).

The second pixel circuit PC2 may include at least one transistor TFT, and may be electrically connected to the second display element DE2 by a connection line TWL. The second pixel circuit PC2 may control the operation of the second display element DE2. The second pixel PX2 may be realized by light emission of the second display element DE2.

In an embodiment, the connection line TWL may include a transparent conductive material. The connection line TWL may include a TCO. The connection line TWL may include a conductive oxide, such as ITO, IZO, ZnO, $In_2O_3$, IGO, or AZO.

In an embodiment, the connection line TWL may be disposed at (e.g., in or on) the same layer as that of the first connection line CNL1 of FIG. 4. For example, the connection line TWL may be located between the second planarization layer 215 and the third planarization layer 216 (e.g., see FIG. 5).

An area in the component area CA, in which the second display element DE2 is not arranged, may be defined as the transmission area TA. The transmission area TA may be an area through which light/signal emitted from the component 30 arranged to correspond to the component area CA or light/signal incident to the component 30 is transmitted. A plurality of components 30 may be arranged, and may have different functions from each other. For example, the components 30 may include at least two from among a camera (e.g., an image pickup device), a solar cell, a flash, a proximity sensor, an illuminance sensor, and an iris sensor.

The connection line TWL connecting the second pixel circuit PC2 to the second display element DE2 may be arranged to at least partially overlap with the transmission area TA. Because the connection line TWL may include a transparent conductive material having high transmittance, the transmittance of the transmission area TA may be secured, even when the connection line TWL is arranged at (e.g., in or on) the transmission area TA. In the present embodiment, because the second pixel circuit PC2 is not arranged at (e.g., in or on) the component area CA, the area of the transmission area TA may be easily expanded, and light transmittance thereof may be further improved.

A third display element DE3, and a third pixel circuit PC3 connected thereto may be arranged at (e.g., in or on) the intermediate area MA of the display panel 10 to implement the third pixel PX3. The second pixel circuit PC2 and the third pixel circuit PC3 arranged at (e.g., in or on) the intermediate area MA may be adjacent to each other, and may be alternately arranged with each other.

As shown in FIG. 12, a bottom metal layer BML may be arranged under (e.g., underneath) the second pixel circuit PC2 and the third pixel circuit PC3 at (e.g., in or on) the intermediate area MA. The bottom metal layer BML may be arranged to overlap with the pixel circuits to protect the pixel circuits. In an embodiment, the bottom metal layer BML may be arranged to overlap with the second and third pixel circuits PC2 and PC3 between the substrate 100 corresponding to the intermediate area MA, and the second and third pixel circuits PC2 and PC3. The bottom metal layer BML may block external light from reaching the second pixel circuit PC2 and the third pixel circuit PC3. In another embodiment, the bottom metal layer BML may be formed to correspond to the entire display area DA (e.g., see FIG. 11), and may include a lower hole corresponding to the component area CA. In another embodiment, the back metal layer BML may be omitted.

The insulating layer IL arranged in the display layer DISL and the insulating layer IL' arranged between the substrate 1000 and the display layer DISL may each have at least one opening. Light emitted from or directed to the component 30 may pass through the opening of each of the insulating layers IL and IL'. The opening of each of the insulating layers IL and IL' may be located in the transmission area TA, and may allow movement of light directed to or emitted from the component 30.

The display element layer may be covered by the sealing member ENCM. The sealing member ENCM may be an encapsulation substrate or a thin-film encapsulation layer TFEL.

In an embodiment, the sealing member ENCM may be an encapsulation substrate. The encapsulation substrate may be arranged to face the substrate 1000 with the display element layer therebetween. A gap may be between the encapsulation substrate and the display element layer. The encapsulation substrate may include glass. A sealant including frit or the like may be arranged between the substrate 1000 and the encapsulation substrate, and the sealant may be arranged at (e.g., in or on) the peripheral area PA described above with reference to FIG. 11. The sealant arranged at (e.g., in or on) the peripheral area PA may surround (e.g., around a periphery of) the display area DA, and may prevent or substantially prevent moisture from penetrating through a side surface of the display area DA.

In another embodiment, the sealing member ENCM may be a thin-film encapsulation layer TFEL. The thin film encapsulation layer TFEL may include at least one inorganic encapsulation layer, and at least one organic encapsulation layer. For example, as shown in FIG. 12, the thin-film encapsulation layer TFEL may include a first inorganic encapsulation layer 1310, a second inorganic encapsulation layer 1330, and an organic encapsulation layer 1320 therebetween.

The protection member PB may be attached to a lower portion of the substrate 1000, to support and protect the substrate 1000. The protection member PB may have an opening PB_OP corresponding to the component area CA of the second area AR2. Because the protection member PB has the opening PB_OP, the light transmittance of the component area CA of the second area AR2 may be improved. The protection member PB may include polyethylene terephthalate (PET) or polyimide (PI).

A display apparatus according to one or more embodiments have been mainly described above. However, the present disclosure is not limited thereto. For example, a method of manufacturing the display apparatus may also be included within the spirit and scope of the present disclosure.

As described above, according to one or more embodiments of the present disclosure, a display apparatus having improved resolution may be implemented. However, the spirit and scope of the disclosure is not limited to those specifically described above.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
a first conductive line extending in a first direction, and comprising a plurality of first conductive patterns that are spaced from each other; and
a first connection line extending in the first direction on the first conductive line, and comprising a plurality of first connection patterns that are spaced from each other, the plurality of first connection patterns connecting the plurality of first conductive patterns to each other,
wherein, in a plan view, the plurality of first conductive patterns and the plurality of first connection patterns are alternately located with each other along the first direction, and
wherein each of at least some of the plurality of first conductive patterns overlaps with and is connected to two adjacent first connection patterns among the plurality of first connection patterns.

2. The display apparatus of claim 1, wherein a transmittance of the first connection line is greater than a transmittance of the first conductive line.

3. The display apparatus of claim 1, wherein the first connection line comprises a transparent conductive material.

4. A display apparatus comprising:
a first conductive line extending in a first direction, and comprising a plurality of first conductive patterns that are spaced from each other; and
a first connection line extending in the first direction on the first conductive line, and comprising a plurality of first connection patterns that are spaced from each other, the plurality of first connection patterns connecting the plurality of first conductive patterns to each other,
wherein, in a plan view, the plurality of first conductive patterns and the plurality of first connection patterns are alternately located with each other along the first direction,
wherein the display apparatus further comprises:
a second conductive line extending in the first direction, and comprising a plurality of second conductive patterns that are spaced from each other;
a second connection line extending in the first direction on the second conductive line, and comprising a plurality of second connection patterns that are spaced from each other, the second connection patterns connecting the plurality of second conductive patterns to each other; and
a plurality of pixels in a matrix arrangement configured to receive a first voltage through the first conductive line, and a second voltage having a different level from that of the first voltage through the second conductive line, and
wherein, in a plan view, the plurality of second conductive patterns and the plurality of second connection patterns are alternately located with each other along the first direction.

5. The display apparatus of claim 4, wherein each of the plurality of pixels comprises:
a display element having an anode and a cathode;
a driving transistor configured to control a driving current flowing to the display element;
a first initialization transistor configured to apply the first voltage to a gate of the driving transistor in response to a first scan signal; and a second initialization transistor configured to apply the second voltage to the anode of the display element in response to a second scan signal.

6. The display apparatus of claim 4, further comprising:
a third conductive line extending in a second direction crossing the first direction, and connected to the first conductive line through the first connection line; and
a fourth conductive line extending in the second direction, and connected to the second conductive line through the second connection line.

7. The display apparatus of claim 6, wherein the first conductive line comprises a plurality of first conductive lines, the second conductive line comprises a plurality of second conductive lines, the third conductive line comprises a plurality of third conductive lines, and the fourth conductive line comprises a plurality of fourth conductive lines,
wherein the plurality of first conductive lines and the plurality of second conductive lines are alternately located with each other along the second direction, and
wherein the plurality of third conductive lines and the plurality of fourth conductive lines are alternately located with each other along the first direction.

8. The display apparatus of claim 6, wherein the first conductive line comprises a plurality of first conductive lines, the second conductive line comprises a plurality of second conductive lines, the third conductive line comprises a plurality of third conductive lines, and the fourth conductive line comprises a plurality of fourth conductive lines,
wherein each of the plurality of first conductive lines and the plurality of second conductive lines is located at each corresponding pixel row, and
wherein each of the plurality of third conductive lines and the plurality of fourth conductive lines is located at every corresponding two pixel columns.

9. The display apparatus of claim 8, wherein a first distance between a first conductive line and a second conductive line that are adjacent to each other in the second direction from among the plurality of first conductive lines and the plurality of second conductive lines is less than a second distance between a third conductive line and a fourth conductive line that are adjacent to each other in the first direction from among the plurality of third conductive lines and the plurality of fourth conductive lines.

10. The display apparatus of claim 8, wherein the plurality of third conductive lines are located at different pixel columns from those of the plurality of fourth conductive lines.

11. The display apparatus of claim 6, wherein the first conductive line comprises a plurality of first conductive lines, the second conductive line comprises a plurality of second conductive lines, the third conductive line comprises a plurality of third conductive lines, and the fourth conductive line comprises a plurality of fourth conductive lines,
wherein each of the plurality of first conductive lines and the plurality of second conductive lines is located at every two corresponding pixel columns, and
wherein each of the plurality of third conductive lines and the plurality of fourth conductive lines is located at each corresponding pixel row.

12. The display apparatus of claim 11, wherein a first distance between a first conductive line and a second conductive line that are adjacent to each other in the second direction from among the plurality of first conductive lines and the plurality of second conductive lines is greater than a second distance between a third conductive line and a fourth conductive line that are adjacent to each other in the first direction from among the plurality of third conductive lines and the plurality of fourth conductive lines.

13. The display apparatus of claim 11, wherein the plurality of first conductive lines are located at different pixel columns from those of the plurality of second conductive lines.

14. The display apparatus of claim 6, further comprising:
a plurality of third conductive patterns connected to the first conductive line through the first connection line, a longitudinal direction of the plurality of third conductive patterns being the second direction; and
a plurality of fourth conductive patterns connected to the second conductive line through the second connection line, a longitudinal direction of the plurality of fourth conductive patterns being the second direction,
wherein the third conductive line comprises a plurality of third conductive lines and the fourth conductive line comprises a plurality of fourth conductive lines,
wherein the plurality of third conductive lines are connected to the first conductive line through first-first connection patterns corresponding to some of the plurality of first connection patterns,
wherein the plurality of third conductive patterns are connected to the first conductive line through first-second connection patterns corresponding to some others of the plurality of first connection patterns,
wherein the plurality of fourth conductive lines are connected to the second conductive line through second-first connection patterns corresponding to some of the plurality of second connection patterns, and
wherein the plurality of fourth conductive patterns are connected to the second conductive line through second-second connection patterns corresponding to some others of the plurality of second connection patterns.

15. The display apparatus of claim 14, wherein:
the first-first connection patterns and the first-second connection patterns are alternately located with each other along the first direction; and
the second-first connection patterns and the second-second connection patterns are alternately located with each other along the first direction.

16. The display apparatus of claim 14, wherein:
the plurality of third conductive lines are located at different pixel columns from those of the plurality of third conductive patterns;
the plurality of fourth conductive lines are located at different pixel columns from those of the plurality of fourth conductive patterns;
the plurality of third conductive lines and the plurality of fourth conductive patterns are located at a same pixel column as each other; and
the plurality of fourth conductive lines and the plurality of third conductive patterns are located at a same pixel column as each other.

17. The display apparatus of claim 6, further comprising:
a third connection pattern having a longitudinal direction in the first direction;
a third conductive pattern connected to the third conductive line through the third connection pattern;
a fourth connection pattern having a longitudinal direction in the first direction; and
a fourth conductive pattern connected to the fourth conductive line through the fourth connection pattern,
wherein a length of each of the plurality of first connection patterns in the first direction is greater than a length of the third connection pattern in the first direction, and wherein a length of each of the plurality of second connection patterns in the first direction is greater than a length of the fourth connection pattern in the first direction.

18. The display apparatus of claim 17, wherein:

the plurality of first connection patterns are located at different pixel columns from that of the third connection pattern;

the plurality of second connection patterns are located at different pixel columns from that of the fourth connection pattern;

the plurality of first connection patterns and the fourth connection pattern are located at a same pixel column as each other; and the plurality of second connection patterns and the third connection pattern are located at a same pixel column as each other.

19. A display apparatus comprising:

a first conductive line extending in a first direction, and comprising a plurality of first conductive patterns that are spaced from each other; and a first connection line extending in the first direction on the first conductive line, and comprising a plurality of first connection patterns that are spaced from each other, the plurality of first connection patterns connecting the plurality of first conductive patterns to each other, wherein, in a plan view, the plurality of first conductive patterns and the plurality of first connection patterns are alternately located with each other along the first direction, and wherein the display apparatus further comprises:

a substrate including a first area, and a second area at least partially surrounded by the first area;

a pixel circuit at the first area;

a display element at the second area, and electrically connected to the pixel circuit; and a connection line connecting the pixel circuit to the display element, and located at a same layer as that of the first connection line.

20. The display apparatus of claim 19, further comprising a component under the substrate at the second area.

* * * * *